US012796448B2

(12) United States Patent
Baek

(10) Patent No.: US 12,796,448 B2
(45) Date of Patent: Nov. 10, 2026

(54) SEMICONDUCTOR PACKAGE

(71) Applicant: SAMSUNG ELECTRONICS CO., LTD., Suwon-si (KR)

(72) Inventor: Seungduk Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 314 days.

(21) Appl. No.: 18/674,339

(22) Filed: May 24, 2024

(65) Prior Publication Data

US 2025/0149444 A1 May 8, 2025

(30) Foreign Application Priority Data

Nov. 2, 2023 (KR) ........................ 10-2023-0150217

(51) Int. Cl.

*H10W 20/41* (2026.01)
*H10W 20/20* (2026.01)
*H10W 20/43* (2026.01)
*H10W 70/60* (2026.01)
*H10W 74/10* (2026.01)
*H10W 80/00* (2026.01)
*H10W 90/00* (2026.01)
*H10W 90/20* (2026.01)

(52) U.S. Cl.

CPC ......... *H10W 20/435* (2026.01); *H10W 20/20* (2026.01); *H10W 20/43* (2026.01); *H10W 90/00* (2026.01); *H10W 70/60* (2026.01); *H10W 74/10* (2026.01); *H10W 80/334* (2026.01); *H10W 90/288* (2026.01); *H10W 90/722* (2026.01); *H10W 90/724* (2026.01); *H10W 90/792* (2026.01)

(58) Field of Classification Search

CPC ... H10W 20/435; H10W 20/43; H10W 20/20; H10W 74/80; H10W 80/334; H10W 70/60; H10W 90/00; H10W 90/724; H10W 90/288722; H10W 90/792

USPC .......................................................... 257/734

See application file for complete search history.

(56) References Cited

U.S. PATENT DOCUMENTS

| | | | |
|---|---|---|---|
| 9,704,827 B2 | 7/2017 | Huang et al. | |
| 10,199,355 B2 | 2/2019 | Kim et al. | |
| 10,692,826 B2 | 6/2020 | Wei et al. | |
| 10,840,190 B1 | 11/2020 | Yang et al. | |
| 11,437,324 B2 | 9/2022 | Momo et al. | |
| 2021/0082823 A1* | 3/2021 | Momo ..................... | H10D 1/68 |

(Continued)

*Primary Examiner* — Igwe U Anya
(74) *Attorney, Agent, or Firm* — Sughrue Mion, PLLC

(57) ABSTRACT

A semiconductor package includes at least one first interconnecting conductor in contact with at least one first pad, and first peripheral conductors on opposites sides of the at least one first interconnecting conductor, the first peripheral conductors extending in a first horizontal direction. The semiconductor package further includes at least one second interconnecting conductor in contact with the at least one second pad, and second peripheral conductors on opposite sides of the at least one second interconnecting conductor, the second peripheral conductors extending in a second horizontal direction, intersecting the first horizontal direction.

In a plan view, first overlapping regions, in which the first peripheral conductors overlap with the second peripheral conductors, are spaced apart from each other in the first horizontal direction and the second horizontal direction.

20 Claims, 25 Drawing Sheets

(56) References Cited

U.S. PATENT DOCUMENTS

| | | | | |
|---|---|---|---|---|
| 2021/0265313 | A1* | 8/2021 | Chen | H10D 1/692 |
| 2022/0285434 | A1* | 9/2022 | Shen | G11C 11/161 |
| 2022/0302085 | A1* | 9/2022 | Chang | H10W 20/023 |
| 2022/0344301 | A1 | 10/2022 | Yu et al. | |
| 2023/0113465 | A1 | 4/2023 | Kim et al. | |

* cited by examiner

SEMICONDUCTOR PACKAGE

CROSS-REFERENCE TO RELATED APPLICATION(S)

This application claims benefit of priority to Korean Patent Application No. 10-2023-0150217, filed on Nov. 2, 2023, in the Korean Intellectual Property Office, the disclosure of which is incorporated herein by reference in its entirety.

BACKGROUND

1. Field

Embodiments of the present disclosure relate to a semiconductor package.

2. Brief Description of Related Art

Semiconductor devices, installed in electronic devices, require the implementation of high performance and high capacity, together with miniaturization. In order to implement high performance and high capacity, together with miniaturization, a semiconductor package has been developed to interconnect semiconductor chips stacked in a vertical direction using a through-electrode (e.g., a through-silicon via).

SUMMARY

According to embodiments of the present disclosure, a semiconductor package having improved reliability is provided.

According to embodiments of the present disclosure, a semiconductor package is provided and includes a first semiconductor chip, and a second semiconductor chip, wherein the first semiconductor chip opposes the second semiconductor chip in a vertical direction. The first semiconductor chip includes: a first substrate; a first interconnection on a first surface of the first substrate; a first insulating layer covering at least a portion of the first interconnection; at least one first pad on the first interconnection; and a first passivation layer surrounding at least a portion of the at least one first pad. The second semiconductor chip includes: a second substrate; a second interconnection on a first surface of the second substrate; a second insulating layer covering at least a portion of the second interconnection; at least one second pad on the second interconnection, the at least one second pad in contact with the at least one first pad; and a second passivation layer covering at least a portion of the at least one second pad, the second passivation layer in contact with the first passivation layer, wherein the first interconnection comprises at least one first interconnecting conductor in contact with the at least one first pad, and first peripheral conductors on opposite sides of the at least one first interconnecting conductor, the first peripheral conductors extending in a first horizontal direction, wherein the second interconnection comprises at least one second interconnecting conductor in contact with the at least one second pad, and second peripheral conductors on opposite sides of the at least one second interconnecting conductor, the second peripheral conductors extending in a second horizontal direction, intersecting the first horizontal direction, and wherein first overlapping regions, in which the first peripheral conductors overlap with the second peripheral conductors, are spaced apart from each other in the first horizontal direction and the second horizontal direction in a plan view.

According to embodiments of the present disclosure, a semiconductor package is provided and includes a first semiconductor chip, and a second semiconductor chip opposing the first semiconductor chip. The first semiconductor chip includes: a first interconnection; at least one first pad on the first interconnection; and a first passivation layer covering at least a portion of the at least one first pad. The second semiconductor chip comprises: a second interconnection; at least one second pad on the second interconnection, the at least one second pad in contact with the at least one first pad; and a second passivation layer covering at least a portion of the at least one second pad, the second passivation layer in contact with the first passivation layer, wherein the first interconnection comprises at least one first interconnecting conductor in contact with the at least one first pad, the at least one first interconnecting conductor elongated in a first horizontal direction, and wherein the second interconnection comprises at least one second interconnecting conductor in contact with the at least one second pad, the at least one second interconnecting conductor elongated in a second horizontal direction, intersecting the first horizontal direction.

According to embodiments of the present disclosure, a semiconductor package is provided and includes a first semiconductor chip, and a second semiconductor chip, wherein the first semiconductor chip opposes the second semiconductor chip in a vertical direction. The first semiconductor chip comprises: a first interconnection; a first insulating layer covering at least a portion of the first interconnection; a plurality of first pads on the first insulating layer, the plurality of first pads electrically connected to the first interconnection; and a first passivation layer covering at least a portion of the plurality of first pads. The second semiconductor chip comprises: a second interconnection; a second insulating layer covering at least a portion of the second interconnection; a plurality of second pads on the second insulating layer, the plurality of second pads electrically connected to the second interconnection, the plurality of second pads respectively in contact with the plurality of first pads; and a second passivation layer covering at least a portion of the plurality of second pads, the second passivation layer in contact with the first passivation layer, wherein the first interconnection comprises first intermediate conductors, and first top conductors between the first intermediate conductors and the plurality of first pads in the vertical direction, wherein the second interconnection comprises second intermediate conductors, and second top conductors between the second intermediate conductors and the plurality of second pads in the vertical direction, wherein at least some of the first top conductors extend in a first horizontal direction, and wherein at least some of the second top conductors extend in a second horizontal direction, intersecting the first horizontal direction.

BRIEF DESCRIPTION OF DRAWINGS

The above and other aspects, features, and advantages of embodiments of the present disclosure will be more clearly understood from the following detailed description, taken in conjunction with the accompanying drawings, in which.

DETAILED DESCRIPTION

Hereinafter, non-limiting example embodiments will be described in detail. Unless otherwise described, terms such as "upper," "upper portion," "upper surface," "lower," "lower portion," "lower surface," and "side surface" are based on the drawings, and may vary depending on a direction in which a component is actually arranged.

In addition, ordinal numbers such as "first," "second," "third," and the like may be used as labels for specific elements, operations, directions, and the like, to distinguish various elements, steps, directions, and the like from one another. A term, not described in the specification using "first," "second," and the like, may still be referred to as "first" or "second" in the claims. In addition, a term referenced by a particular ordinal number (e.g., "first" in a particular claim) may be described elsewhere with a different ordinal number (e.g., "second" in the specification or another claim).

It will be understood that when an element or layer is referred to as being "on," "connected to," or "coupled to" another element or layer, it can be directly on, connected to, or coupled to the other element or layer or intervening elements or layers may be present. In contrast, when an element or layer is referred to as being "directly on," "directly connected to," or "directly coupled to" another element or layer, there are no intervening elements or layers present.

Figure 1A:
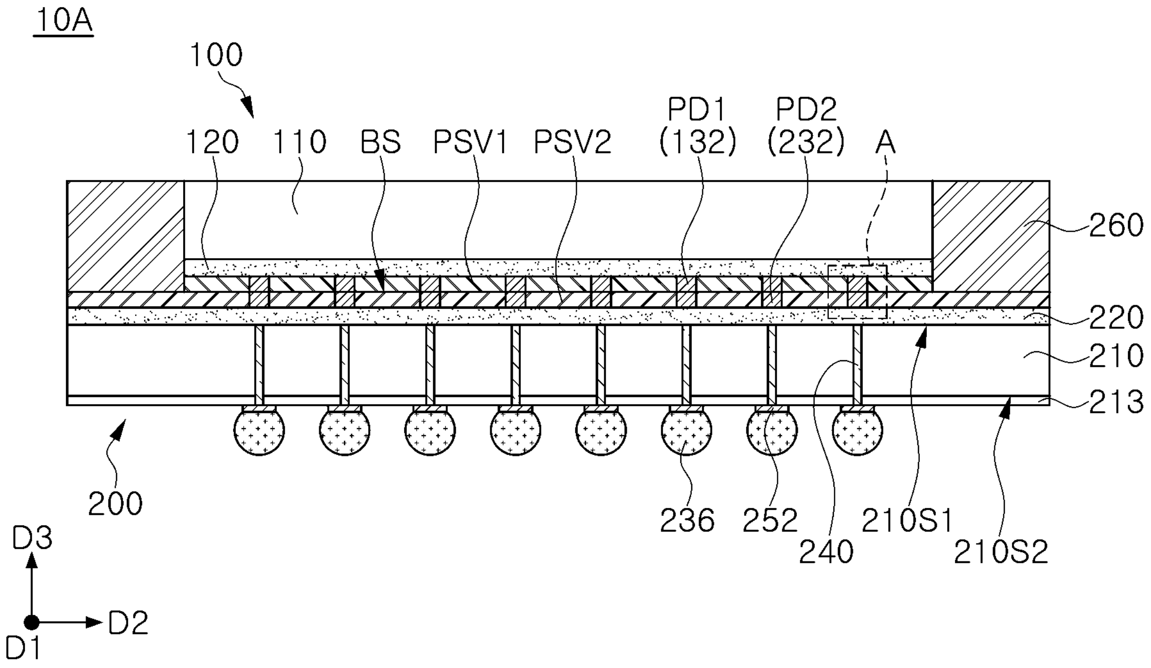
FIG. 1A is a cross-sectional view of a semiconductor package according to an example embodiment of the present disclosure.
Figure 1B:
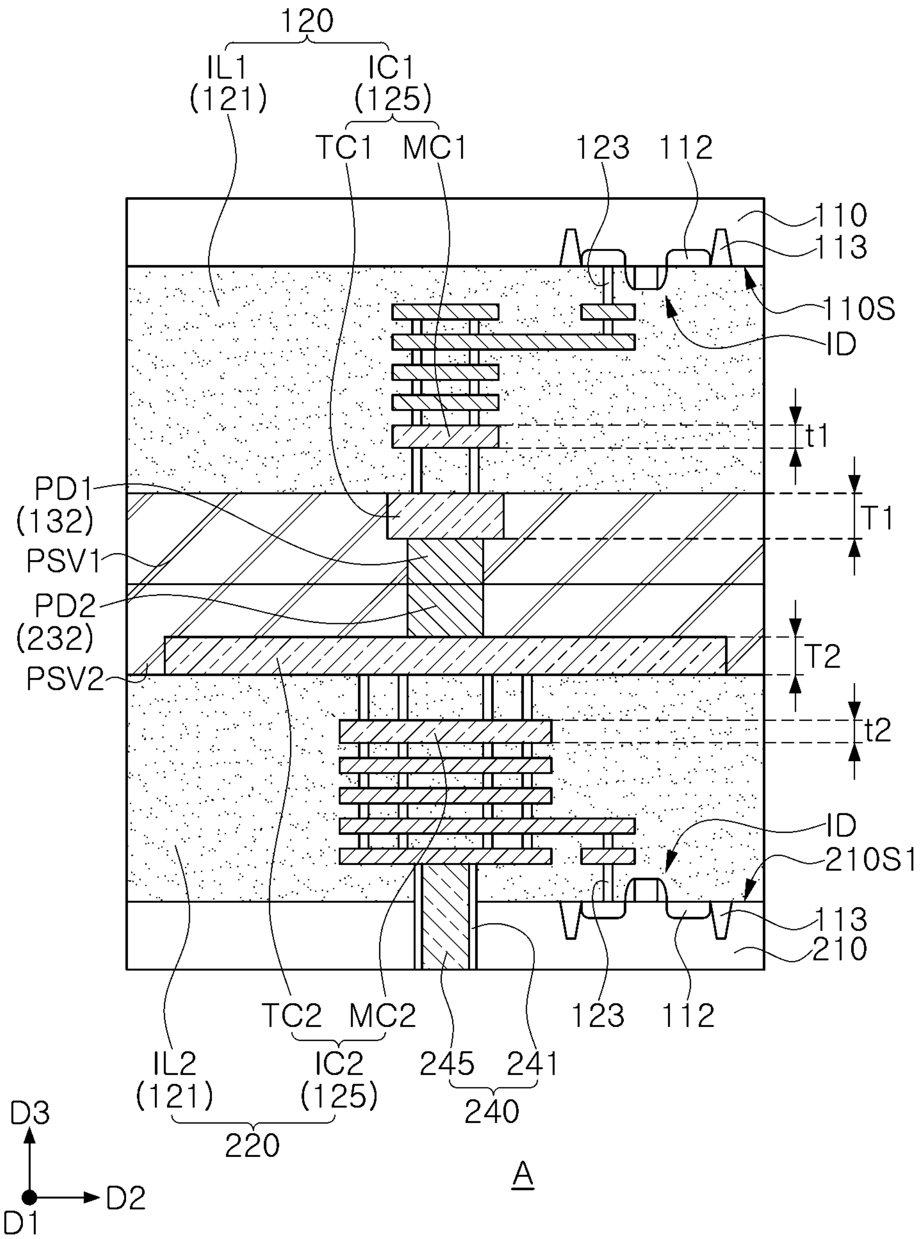
FIG. 1B is a partial enlarged view of a region "A" of FIG. 1A.

FIG. 1A is a cross-sectional view of a semiconductor package 10A according to an example embodiment of the present disclosure, and FIG. 1B is a partial enlarged view of a region A of FIG. 1A.

Figure 2A:
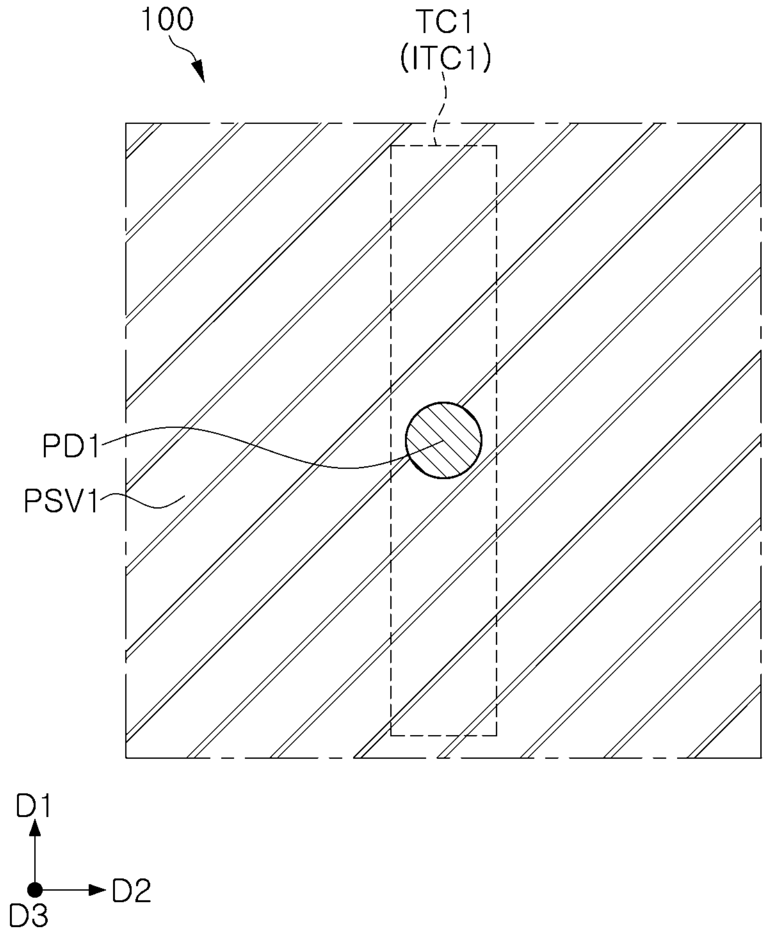
FIG. 2A is a plan view illustrating a planar shape of a first top conductor of FIG. 1B.
Figure 2B:
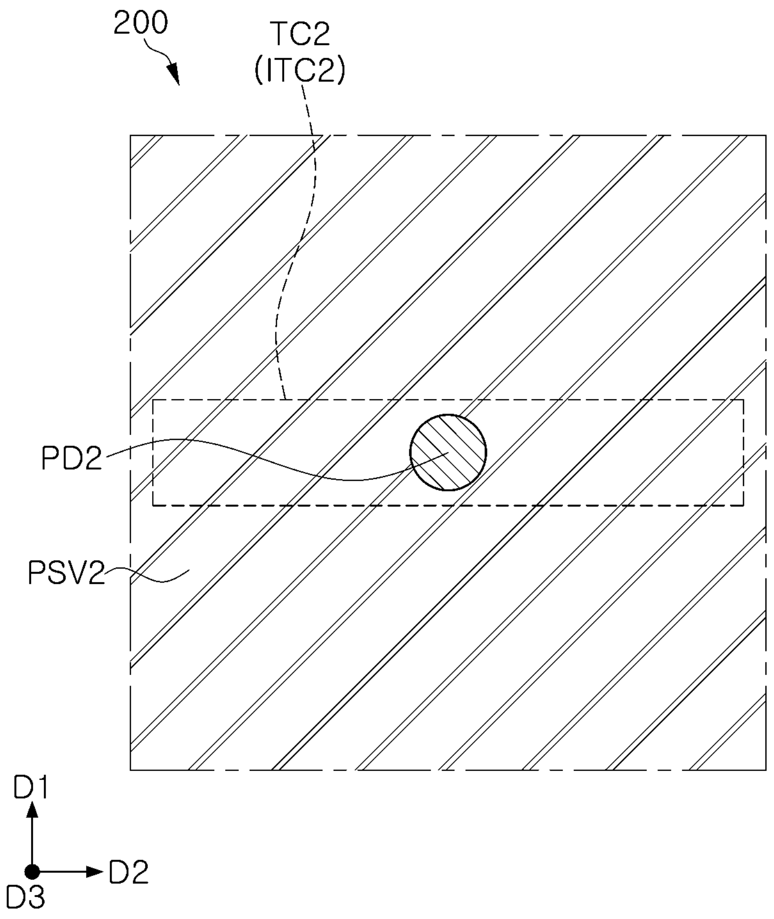
FIG. 2B is a plan view illustrating a planar shape of a second top conductor of FIG. 1B.

FIGS. 2A and 2B are plan views respectively illustrating planar shapes of a first top conductor TC1 and a second top conductor TC2 of FIG. 1B.

Referring to FIGS. 1A, 1B, 2A, and 2B, the semiconductor package 10A according to the example embodiment may include two or more semiconductor chips opposing each other in a vertical direction D3, for example, a first semiconductor chip 100 and a second semiconductor chip 200. Two or more first semiconductor chips 100 may be disposed on the second semiconductor chip 200. The first semiconductor chip 100 and the second semiconductor chip 200 may include chiplets included in a multi-chip module (MCM). In some example embodiments, the semiconductor package 10A may further include a mold layer 260 sealing at least a portion of each of the first semiconductor chip 100 and the second semiconductor chip 200. The mold layer 260 may include, for example, an epoxy mold compound (EMC), but the material of the mold layer 260 is not particularly limited.

The first semiconductor chip 100 and the second semiconductor chip 200 may be bonded and coupled to each other using inter-metal bonding and inter-dielectric bonding. The semiconductor package 10A may have a bonding surface BS defined by where a first pad PD1 and a first passivation layer PSV1 of the first semiconductor chip 100 and a second pad PD2 and a second passivation layer PSV2 of the second semiconductor chip 200 are bonded and coupled to each other. According to example embodiments, a first top conductor TC1 and a second top conductor TC2, respectively disposed above the first passivation layer PSV1 and below the second passivation layer PSV2 that are bonded to each other, may extend in different directions, such that an overlapping region between the first top conductor TC1 and the second top conductor TC2 around the first pad PD1 and the second pad PD2 may be minimized. As a result, a degradation in quality of the bonding surface BS, caused by expansion of the first passivation layer PSV1 and the second passivation layer PSV2 in a thermocompression bonding process, may be prevented.

The first semiconductor chip 100 may include a first substrate 110, a first circuit layer 120, a first passivation layer PSV1, and a plurality of first pads PD1.

The first substrate 110 may be a semiconductor wafer. The first substrate 110 may include, for example, a semiconductor element such as silicon or germanium, or a compound semiconductor silicon carbide (SiC), gallium arsenide (GaAs), indium arsenide (InAs), and indium phosphide (InP). The first substrate 110 may have a conductive region 112 and an isolation region 113, formed on one surface 110S thereof. The conductive region 112 may be, for example, a well doped with impurities or a structure doped with impurities. The isolation region 113, which may be a device isolation structure having a shallow trench isolation (STI) structure, may include silicon oxide.

The first circuit layer 120 may be disposed on the one surface 110S of the first substrate 110 on which the conductive region 112 is formed. The first circuit layer 120 may include individual devices ID, a first insulating layer IL1, and a first interconnection IC1. Hereinafter, the first insulating layer IL1 may be referred to as a front insulating layer or an interlayer insulating layer 121. The first interconnection IC1 may be referred to as an interconnection structure 125.

The individual devices ID may be disposed on the one surface 110S of the first substrate 110. The individual devices ID may be electrically connected to the conductive region 112. The individual devices ID may include, for example, a field effect transistor (FET) such as a planar FET or a FinFET, a memory device such as a flash memory, a dynamic random access memory (DRAM), a static random access memory (SRAM), an electrically erasable memory (EEPROM), a phase-change random access memory (PRAM), a magneto-resistive random access memory (MRAM), a ferroelectric random access memory (FeRAM), or a resistive random access memory (RRAM), a logic device such as AND, OR, or NOT, and various active and/or passive devices such as a system large scale integration (LSI), a CMOS imaging sensor (CIS), and a micro-electro-mechanical system (MEMS).

The interlayer insulating layer 121 may be formed to cover the individual devices ID and the interconnection structure 125 to electrically isolate the individual devices ID, disposed on the first substrate 110, from each other. The interlayer insulating layer 121 may include flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), high-density plasma (HDP) oxide, plasma enhanced oxide (PEOX), flowable CVD (FCVD) oxide, or combinations thereof. At least a portion of the interlayer insulating layer 121, surrounding the interconnection structure 125, may include a low dielectric layer. The interlayer insulating layer 121 may be formed using a chemical vapor deposition (CVD) process, a flowable CVD process, or a spin coating process.

The interconnection structure 125 may have a multilayer structure including a plurality of interconnection patterns and a plurality of vias formed of, for example, aluminum (Al), gold (Au), cobalt (Co), copper (Cu), nickel (Ni), lead (Pb), tantalum (Ta), tellurium (Te), titanium (Ti), tungsten (W), or combinations thereof. A barrier film including titanium (Ti), titanium nitride (TiN), tantalum (Ta), or tantalum nitride (TaN) may be disposed between the interconnection pattern or/and via and the interlayer insulating layer 121. The interconnection structure 125 may be electrically connected to the individual devices ID by an interconnector 123 (e.g., a contact plug).

In an example embodiment, the first interconnection IC1 may include first intermediate conductors MC1 and first top conductors TC1. The first intermediate conductors MC1 may be disposed in the first insulating layer IL1. The first intermediate conductors MC1 may be positioned between the one surface 110S of the first substrate 110 and the first top conductors TC1. The first top conductors TC1 may be positioned between the first intermediate conductors MC1 and the plurality of first pads PD1 in the vertical direction D3. At least some of the first top conductors TC1 may extend in a first horizontal direction D1. As illustrated in FIG. 2A, the first top conductors TC1 may include at least one first interconnecting conductor ITC1 in contact with at least one first pad PD1, the at least one first interconnecting conductor ITC1 having a long side extending in the first horizontal direction D1. In this case, the first interconnecting conductor ITC1 may provide a power or ground transmission path, but embodiments of the present disclosure are not limited thereto. A thickness T1 of each of the first top conductors TC1 may be greater than a thickness t1 of each of the first intermediate conductors MC1. The thickness T1 of each of the first top conductors TC1 may be about 1 μm or more, for example, may range from about 1 μm to about 30 μm, from about 1 μm to about 20 μm, from about 1 μm to about 10 μm, about, or from 1 μm to about 5 μm, but embodiments of the present disclosure are not limited thereto. According to an example embodiment, second top conductors TC2 of the second semiconductor chip 200 extend in a direction, different from an extension direction of the first top conductors TC1, thereby improving the quality of a bonding surface between the first semiconductor chip 100 and the second semiconductor chip 200. The first top conductor TC1 and the second top conductor TC2 may include aluminum (Al) or an alloy thereof, but embodiments of the present disclosure are not limited thereto. In some example embodiments, the first top conductor TC1 and the second top conductor TC2 may include a material similar or the same as a material of the first intermediate conductor MC1 and the second intermediate conductor MC2, for example, copper (Cu), or alloys thereof.

In an example embodiment, a second interconnection IC2, of a second circuit layer 220 of the second semiconductor chip 200, may include second intermediate conductors MC2 and second top conductors TC2. The second intermediate conductors MC2 may be disposed in a second insulating layer IL2 of the second circuit layer 220 of the second semiconductor chip 200. The second intermediate conductors MC2 may be positioned between one surface 210S1 of a second substrate 210, of the second semiconductor chip 200, and the second top conductors TC2. The second top conductors TC2 may be positioned between the second intermediate conductors MC2 and a plurality of second pads PD2 in the vertical direction D3. At least some second top conductors TC2 may extend in a second horizontal direction D2, intersecting the first horizontal direction D1. As illustrated in FIG. 2B, the second top conductors TC2 may include a second interconnecting conductor ITC2 in contact with at least one second pad PD2, the second interconnecting conductor ITC2 having a long side extending in the second horizontal direction D2. A thickness T2 of each of the second top conductors TC2 may be greater than a thickness t2 of each of the second intermediate conductors MC2. The thickness T2 of the second top conductors TC2 may be about 1 μm or more, for example, may range from about 1 μm to about 30 μm, from about 1 μm to about 20 μm, from about 1 μm to about 10 μm, or from about 1 μm to about 5 μm, but embodiments of the present disclosure are not limited thereto.

The plurality of first pads PD1 may be disposed on the first interconnection IC1. The plurality of first pads PD1 may be electrically connected to the first interconnection IC1 through the first interconnecting conductor ITC1. The plurality of first pads PD1 may include at least one from among copper (Cu), nickel (Ni), gold (Au), silver (Ag), titanium (Ti), titanium nitride (TiN), tantalum (Ta), and tantalum nitride (TaN). For example, the plurality of first pads PD1 may include at least one from copper (Cu) and an alloy thereof. A thickness of each of the plurality of first pads PD1 may be 0.5 times or more and 2 times or less the thickness T1 of the first interconnecting conductor ITC1, but embodiments of the present disclosure are not limited thereto. In order to distinguish positions of components in the first semiconductor chip 100 from each other, the plurality of first pads PD1 may be referred to as front pads 132.

The plurality of second pads PD2 may be disposed on the second interconnection IC2. The plurality of second pads PD2 may be electrically connected to the second interconnection IC2 through the second interconnecting conductor ITC2. The plurality of second pads PD2 may include at least one from among copper (Cu), nickel (Ni), gold (Au), silver (Ag), titanium (Ti), titanium nitride (TiN), tantalum (Ta), and tantalum nitride (TaN). For example, the plurality of second pads PD2 may include at least one from copper (Cu) and an alloy thereof. A thickness of each of the plurality of second pads PD2 may be 0.5 times or more and 2 times or less the thickness T1 of the second interconnecting conductor ITC2, but embodiments of the present disclosure are not limited thereto. In order to distinguish positions of components in the second semiconductor chip 200 from each other, the plurality of second pads PD2 may be referred to as front pads 232.

The first passivation layer PSV1 may be formed to surround side surfaces of the plurality of first pads PD1. The first passivation layer PSV1 may form a bonding surface provided for inter-dielectric bonding between the plurality of first pads PD1. The first passivation layer PSV1 may include, for example, silicon oxide (SiO) or silicon carbonitride (SiCN).

The second passivation layer PSV2 may be formed to surround side surfaces of the plurality of second pads PD2. The second passivation layer PSV2 may form a bonding surface provided for inter-dielectric bonding between the plurality of second pads PD2. The second passivation layer PSV2 may include, for example, silicon oxide (SiO) or silicon carbonitride (SiCN).

In a thermal compression process, the quality of a bonding surface between the first passivation layer PSV1 and the second passivation layer PSV2 may be affected by an arrangement of the first top conductors TC1 and the second top conductors TC2 positioned immediately therebelow (or thereabove). According to example embodiments, expansion of the first passivation layer PSV1 and the second passivation layer PSV2 around the first pads PD1 and the second pads PD2, bonded to each other, may be minimized, thereby implementing a semiconductor package with excellent bonding quality.

The second semiconductor chip 200 may be disposed on one surface of the first semiconductor chip 100. In the second semiconductor chip 200, the plurality of second pads PD2 may be disposed in a direction, opposing the front pads 132 of the first semiconductor chip 100. In the present example embodiment, the second insulating layer IL2 may be referred to as a front insulating layer or an interlayer insulating layer 121, and the second interconnection IC2 may be referred to as an interconnection structure 125.

The second semiconductor chip 200 may include the second substrate 210, the second circuit layer 220, the second passivation layer PSV2, the plurality of second pads PD2, a plurality of through-electrodes 240 (e.g., through-vias), and a plurality of protruding electrodes 252. The second semiconductor chip 200 may include components substantially similar to those of the first semiconductor chip 100. For example, the second substrate 210 may be substantially similar to the first substrate 110, the second circuit layer 220 may be substantially similar to the first circuit layer 120, the second passivation layer PSV2 may be substantially similar to the first passivation layer PSV1, and the plurality of second pads PD2 may be substantially similar to the first pads PD1. Accordingly, the same or similar components are indicated by the same or similar terms and/or reference numerals, and repeated descriptions will be omitted below.

The through-electrodes 240 may pass through one surface 210S1 and the other surface 210S2 of the second substrate 210 to electrically connect the second interconnection IC2 and the protruding electrode 252. The one surface 210S1 of the second substrate 210 may be referred to as a front surface or a rear surface depending on whether a conductive region 112 (e.g., an active region) is formed. For example, the one surface 210S1 of the second substrate 210 according to the present example embodiment may be referred to as a "'front surface," and the one surface 210S1 of the second substrate 210 according to the example embodiment of FIG. 7B may be referred to as a "rear surface." The through-electrodes 240 may include a via plug 245, and a side barrier layer 241 surrounding a side surface thereof. The via plug 245 may include, for example, tungsten (W), titanium (Ti), aluminum (Al), or copper (Cu), and may be formed using a plating process, a PVD process, or a CVD process. The side barrier layer 241 may include titanium (Ti), titanium nitride (TiN), tantalum (Ta), or tantalum nitride (TaN), and may be formed using a plating process, a PVD process, or a CVD process. A side insulating film including an insulating material (e.g., a high aspect ratio process (HARP) oxide), such as silicon oxide, silicon nitride, or silicon oxynitride, may be formed between the side barrier layer 241 and the second substrate 210.

The through-electrodes 240 may pass through an insulating protective layer 213, formed on the other surface 210S2 of the second substrate 210. The insulating protective layer 213 may include, for example, silicon oxide (SiO), silicon nitride (SiN), silicon carbide (SiC), silicon oxynitride (SiON), or silicon carbonitride (SiCN). A buffer film 214 (see FIG. 7B), such as a polishing stop layer or barrier, may be disposed on an upper surface of the insulating protective layer 213. For example, the buffer film may include silicon nitride, silicon carbide, silicon oxynitride, or silicon carbonitride.

The protruding electrodes 252 may be disposed on the other surface 210S2 of the second substrate 210. The protruding electrodes 252 may be electrically connected to the second interconnection IC2 and/or the front pad 232 through the through-electrodes 240. The protruding electrodes 252 may be referred to as "rear pads." The protruding electrodes 252 may be connected to connection bumps 236. The connection bumps 236 may include, for example, tin (Sn), indium (In), bismuth (Bi), antimony (Sb), copper (Cu), silver (Ag), zinc (Zn), and lead (Pb), and/or alloys thereof.

In some example embodiments, the connection bumps 236 may have a combination of a metal pillar and a solder ball.

Hereinafter, an arrangement relationship between the first top conductors TC1 and the second top conductors TC2 will be described with reference to FIGS. 3A and 3B.

Figure 3A:
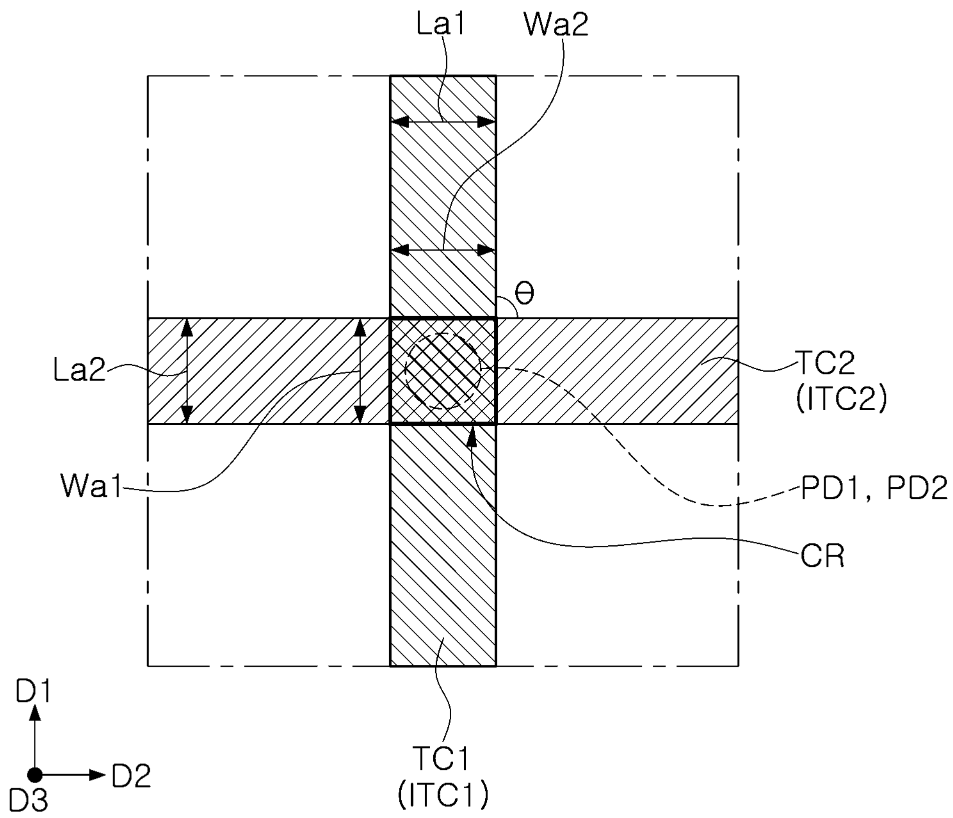
FIG. 3A is a plan view illustrating an arrangement relationship between first and second top conductors according to an example embodiment.
Figure 3B:
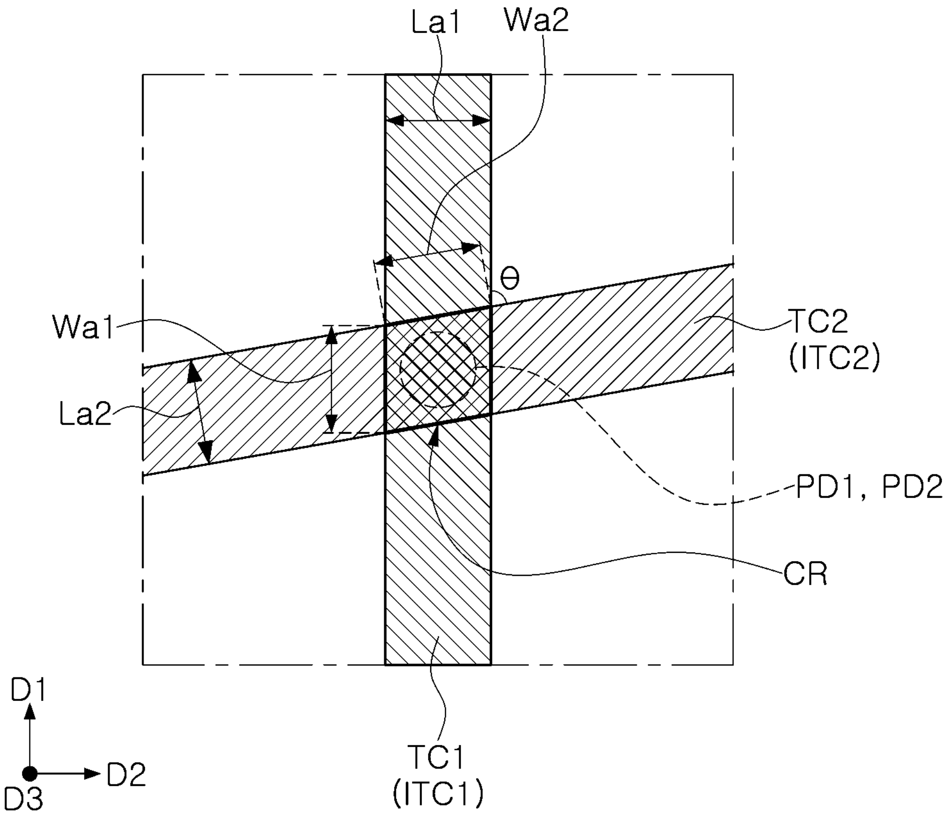
FIG. 3B is a plan view illustrating an arrangement relationship between first and second top conductors according to an example embodiment.

FIGS. 3A and 3B are plan views illustrating an arrangement relationship between the first top conductor TC1 and the second top conductor TC2 according to an example embodiment. FIGS. 3A and 3B illustrate the first top conductor TC1 and the second top conductor TC2 and the first pad PD1 and the second pad PD2 arranged in a plan view.

Referring to FIGS. 3A and 3B, the first top conductor layer TC1 and the second top conductor layer TC2 may include a first interconnecting conductor ITC1 and a second interconnecting conductor ITC2, respectively. The first interconnecting conductor ITC1 may extend in a first horizontal direction D1, and the second interconnecting conductor ITC2 may extend in a second horizontal direction D2 having a predetermined angle 0 with the first horizontal direction D1.

In the plan view, a perimeter of an overlapping region CR between the first interconnecting conductor ITC1, the first pad PD1, the second interconnecting conductor ITC2, and the second pad PD2 may be disposed in a non-overlapping region in which the first interconnecting conductor ITC1 and the second interconnecting conductor ITC2 do not overlap each other.

In addition, in the plan view, the overlapping region CR between the first interconnecting conductor ITC1 and the second interconnecting conductor ITC2 may have a first width Wa1 extending in the first horizontal direction D1, and a second width Wa2 extending in the second horizontal direction D2. The first width Wa1 may be equal to or greater than a line width La2 of the second interconnecting conductor ITC2. The second width Wa2 may be equal to or greater than a line width Lal of the first interconnecting conductor ITC1. The line width Lal of the first interconnecting conductor ITC1 and the line width La2 of the second interconnecting conductor ITC2 may be about 50 μm or less, for example, may range from about 1 μm to about 50 μm, from about 1 μm to about 40 μm, from about 1 μm to about 30 μm, from about 1 μm to about 20 μm, or from about 5 μm to about 10 μm, but embodiments of the present disclosure are not limited thereto. In some example embodiments, the line width Lal of the first interconnecting conductor ITC1 and the line width La2 of the second interconnecting conductor ITC2 may be different from each other.

As illustrated in FIG. 3A, when the angle μ between the first horizontal direction D1 and the second horizontal direction D2 is about 90°, the first width Wa1 may be equal to the line width La2 of the second interconnecting conductor ITC2, and the second width Wa2 may be equal to the line width Lal of the first interconnecting conductor ITC1.

As illustrated in FIG. 3B, when the predetermined angle μ between the first horizontal direction D1 and the second horizontal direction D2 is less than about 90°, the first width Wa1 may be greater than the line width La2 of the second interconnecting conductor ITC2, and the second width Wa2 may be greater than the line width La1 of the first interconnecting conductor ITC1.

Figure 4A:
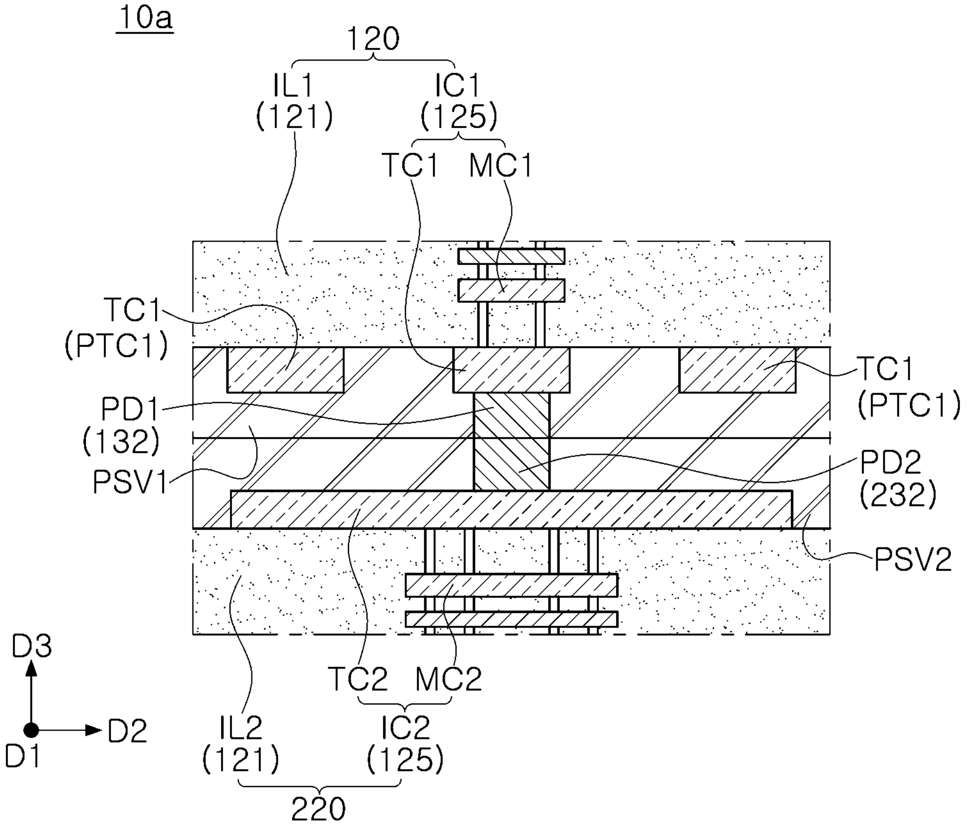
FIG. 4A is a partially enlarged view of a semiconductor package according to an example embodiment of the present disclosure.
Figure 4B:
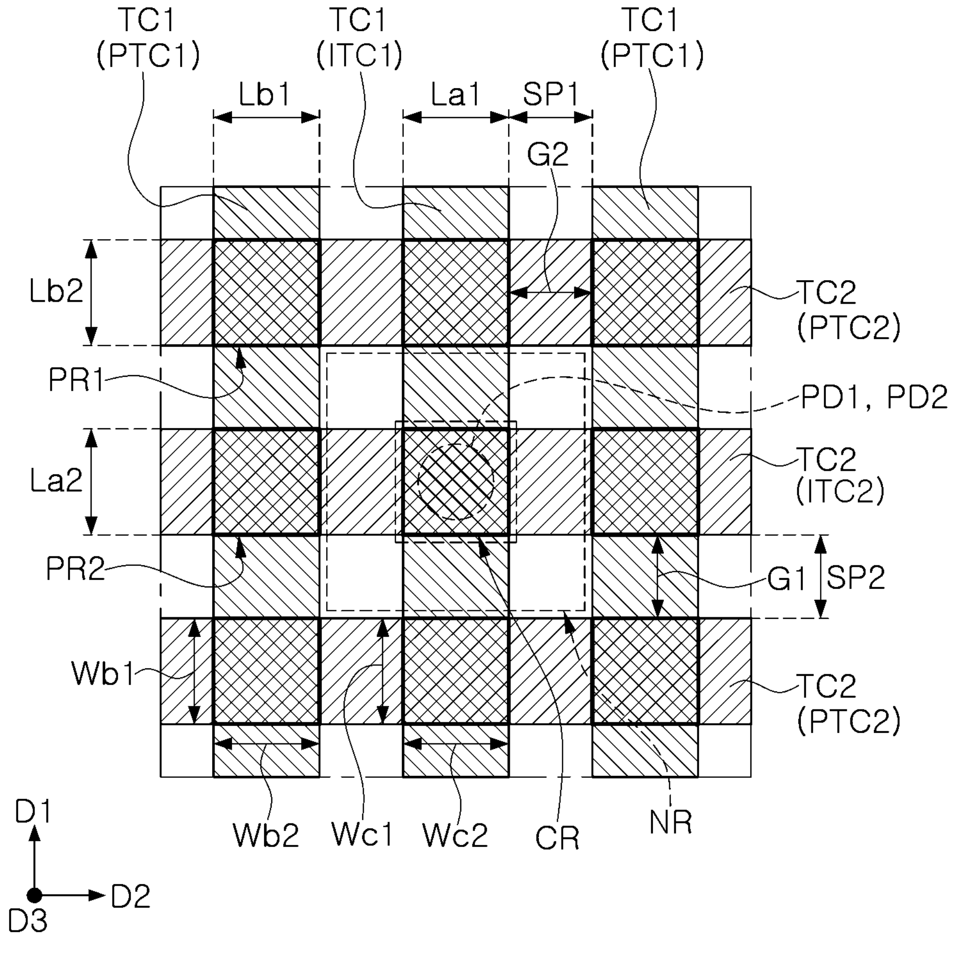
FIG. 4B is a plan view illustrating an arrangement relationship between first and second top conductors of FIG. 4A.

FIG. 4A is a partially enlarged view of a semiconductor package 10*a* according to an example embodiment of the present disclosure, and FIG. 4B is a plan view illustrating an arrangement relationship between the first top conductor TC1 and the second top conductor TC2 of FIG. 4A.

Referring to FIGS. 4A and 4B, the semiconductor package 10*a* according to an example embodiment may have features the same as or similar to those described with reference to FIGS. 1A to 3B, except that the first top conductor TC1 and the second top conductor TC2 further include first peripheral conductors PTC1 and second first peripheral conductors PTC2, respectively.

A first top conductor TC1 may include a first interconnecting conductor ITC1 and first peripheral conductors PTC1. The first peripheral conductors PTC1 may be disposed on one side or both sides of the first interconnecting conductor ITC1. The first peripheral conductors PTC1 may extend in a same direction as the first interconnecting conductor ITC1, for example, a first horizontal direction D1.

A second top conductor TC2 may include a second interconnecting conductor ITC2 and second peripheral conductors PTC2. The second peripheral conductors PTC2 may be disposed on one side or both sides of the second interconnecting conductor ITC2. The second peripheral conductors PTC2 may extend in a same direction as the second interconnecting conductor ITC2, for example, a second horizontal direction D2.

In the plan view, first overlapping regions PRI of the first peripheral conductors PTC1 and the second peripheral conductors PTC2 may be spaced apart from each other in the first horizontal direction D1 and the second horizontal direction D2.

In the plan view, an overlapping region CR between the first interconnecting conductor ITC1, the first pad PD1, the second interconnecting conductor ITC2, and the second pad PD2 may be spaced apart from the first overlapping regions PR1. The overlapping region CR may be surrounded by a non-overlapping region NR in which the first interconnecting conductor ITC1, the first peripheral conductors PTC1, the second interconnecting conductor ITC2, and the second peripheral conductors PTC2 do not overlap each other.

In the plan view, second overlapping regions PR2, in which the first interconnecting conductor ITC1 and the second interconnecting conductor ITC2 respectively overlap the second peripheral conductors PTC2 and the first peripheral conductors PTC1, may be spaced apart from and adjacent to the first overlapping regions PR1 in the first horizontal direction D1 and the second horizontal direction D2. A first gap G1 between the first overlapping regions PRI and the second overlapping regions PR2 in the first horizontal direction D1 may be equal to a distance SP2 between the second interconnecting conductor ITC2 and the second peripheral conductors PTC2, and a second gap G2 between the first overlapping regions PRI and the second overlapping regions PR2 in the second horizontal direction D2 may be equal to a distance SP1 between the first interconnecting conductor ITC1 and the first peripheral conductors PTC1. The distance SP1 and the distance SP2 may be about 50 μm or less, for example, may range from about 1 μm to about 50 μm, from about 1 μm to about 40 μm, from about 1 μm to about 30 μm, from about 1 μm to about 20 μm, or from about 5 μm to about 10 μm, but embodiments of the present disclosure are not limited thereto.

In the plan view, each of the first overlapping regions PR1 may have a first width Wb1 in the first horizontal direction D1 and a second width Wb2 in the second horizontal direction D2. The first width Wb1 of each of the first overlapping regions PR1 may be equal to or greater than a line width Lb2 of the second peripheral conductor PTC2. The second width Wb2 of each of the first overlapping regions PRI may be equal to or greater than a line width Lb1 of the first peripheral conductor PTC1.

Each of the second overlapping regions PR2 may have a first width Wc1 in the first horizontal direction D1 and a second width Wc2 in the second horizontal direction D2. The first width Wc1 of each of the third overlapping regions PR2 may be equal to or greater than the line width Lb2 of the second peripheral conductor PTC2. The second width Wc2 of each of the third overlapping regions PR2 may be equal to or greater than the line width Lb1 of the first peripheral conductor PTC1. The line width Lb1 of the first peripheral conductor PTC1 and the line width Lb2 of the second peripheral conductor PTC2 may be about 50 μm or less, for example, may range from about 1 μm to about 50 μm, from about 1 μm to about 40 μm, from about 1 μm to about 30 μm, from about 1 μm to about 20 μm, or from about 5 μm to about 10 μm, but embodiments of the present disclosure are not limited thereto. In some example embodiments, the line width Lb1 of the first peripheral conductors PTC1 and the line width Lb2 of the second peripheral conductors PTC2 may be different from the line width La1 of the first interconnecting conductors ITC1 and the line width La2 of the second interconnecting conductors ITC2 (see FIG. 5B).

Figure 5A:
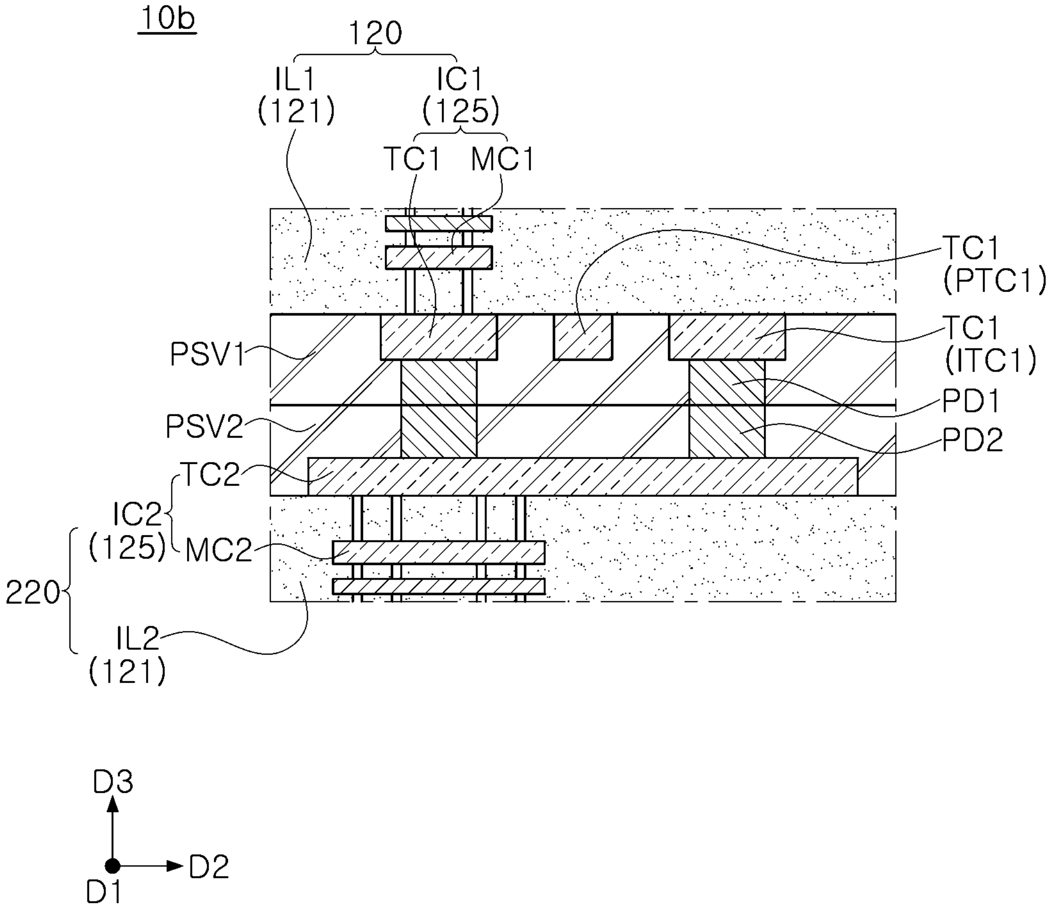
FIG. 5A is a partially enlarged view of a semiconductor package according to an example embodiment of the present disclosure.
Figure 5B:
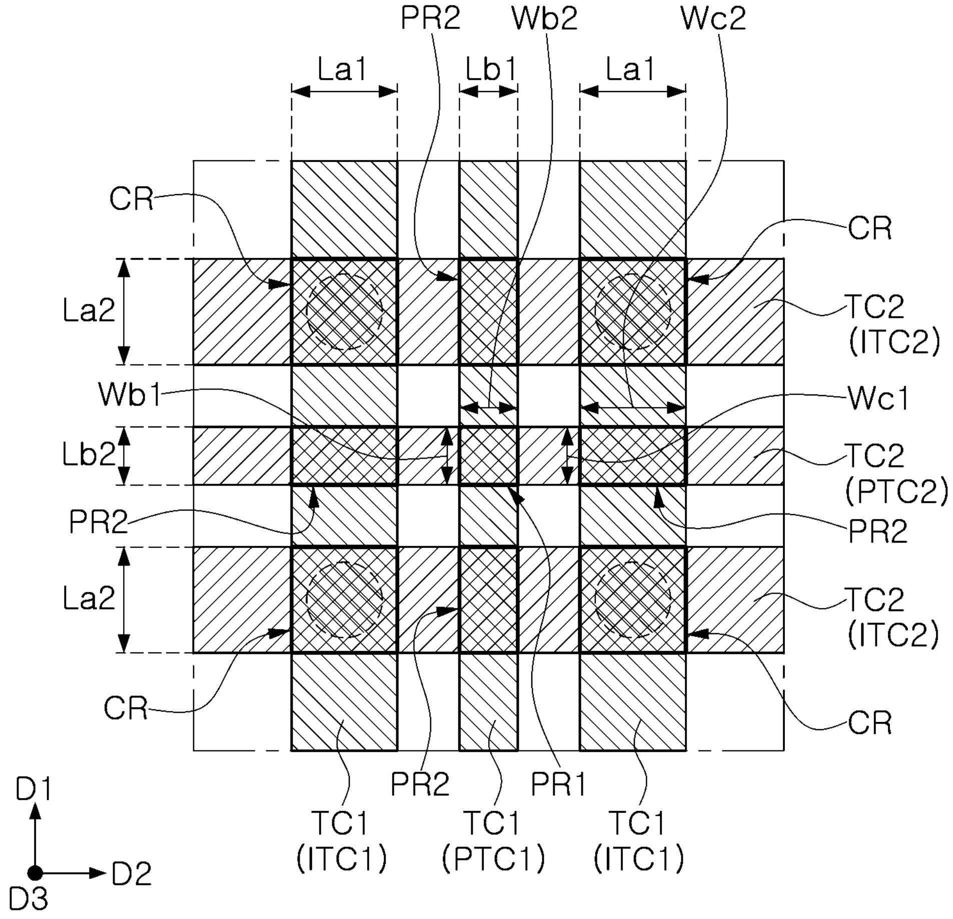
FIG. 5B is a plan view illustrating an arrangement relationship between first and second top conductors of FIG. 5A.

FIG. 5A is a partially enlarged view of a semiconductor package 10*b* according to an example embodiment of the present disclosure, and FIG. 5B is a plan view illustrating an arrangement relationship between the first top conductors TC1 and the second top conductors TC2 of FIG. 5A.

Referring to FIGS. 5A and 5B, the semiconductor package 10*b* according to an example embodiment may have features the same as or similar to those described with reference to FIGS. 1A to 4B, except that the first top conductors TC1 and the second top conductors TC2 further include first interconnecting conductors ITC1 and second interconnecting conductors ITC2 in contact with a plurality of first pads PD1 and a plurality of second pads PD2.

First top conductors TC1 may include a plurality of first interconnecting conductors ICT1 spaced apart from each other in a second horizontal direction D2. The plurality of first pads PD1 may be arranged in the first horizontal direction D1, on the plurality of first interconnecting conductors ICT1. First peripheral conductors PTC1 may be disposed on one side or both sides of the first interconnecting conductor ITC1.

Second top conductors TC2 may include a plurality of second interconnecting conductors ITC2 spaced apart from each other in the first horizontal direction D1. The plurality of second pads PD2 may be arranged in the second horizontal direction D2, on the plurality of second interconnecting conductors ICT2. The plurality of second pads PD2 and the plurality of first pads PD1, corresponding to each other, may be in contact with each other in the vertical direction D3. Second peripheral conductors PTC2 may be disposed on one side or both sides of the second interconnecting conductor ITC2.

In the plan view, second overlapping regions PR2, in which a plurality of first interconnecting conductors ITC1 and a plurality of second interconnecting conductors ITC2 respectively overlap the second peripheral conductors PTC2 and the first peripheral conductors PTC1, may be arranged around the first pads PD1 and the second pads PD2. The second overlapping regions PR2 may be disposed alternately with the first overlapping regions PR1 in the first horizontal direction D1 and the second horizontal direction D2.

Figure 6A:
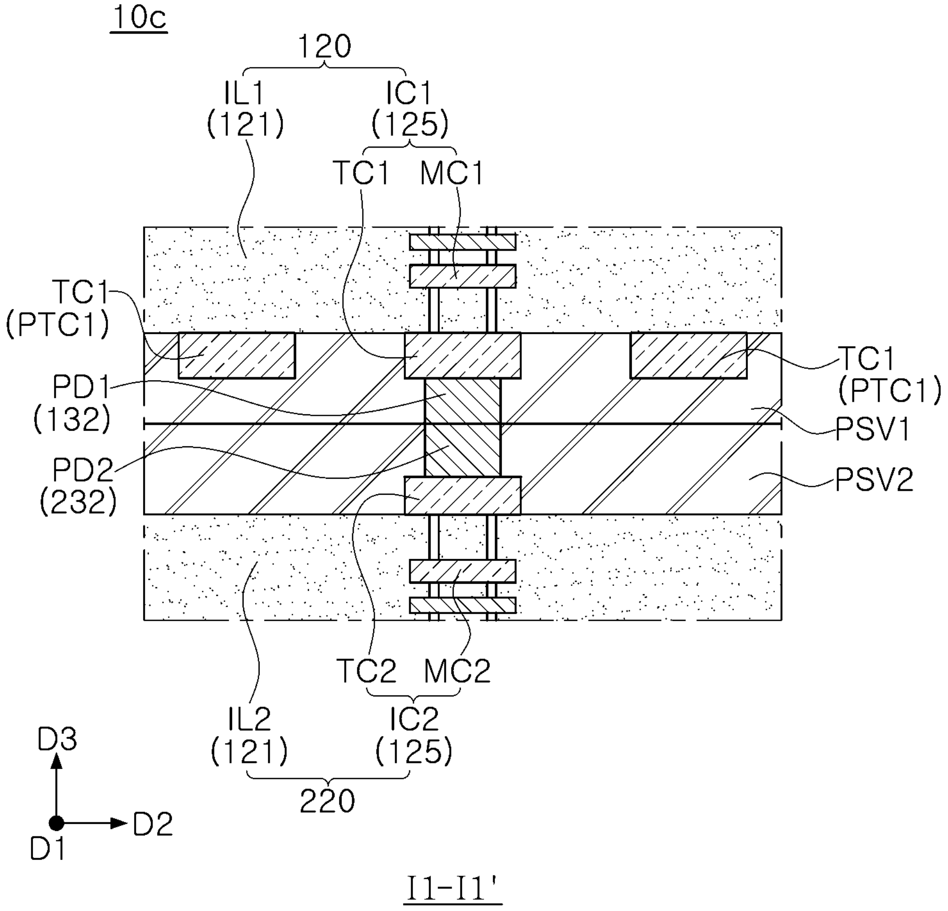
FIG. 6A is a partially enlarged view of a semiconductor package according to an example embodiment of the present disclosure.
Figure 6B:
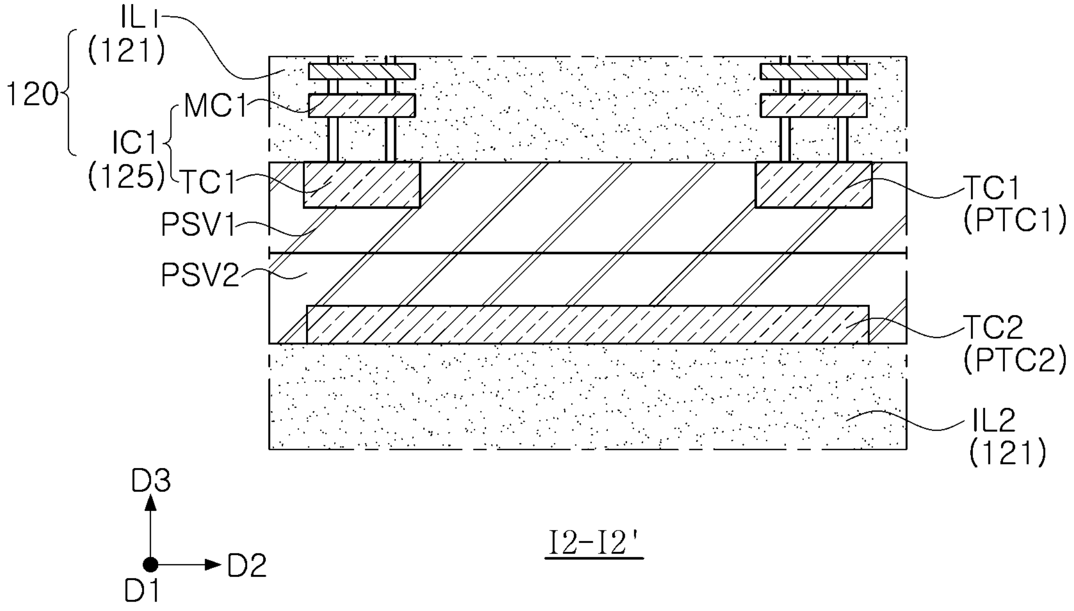
FIG. 6B is a partially enlarged view of a semiconductor package according to an example embodiment of the present disclosure.
Figure 6C:
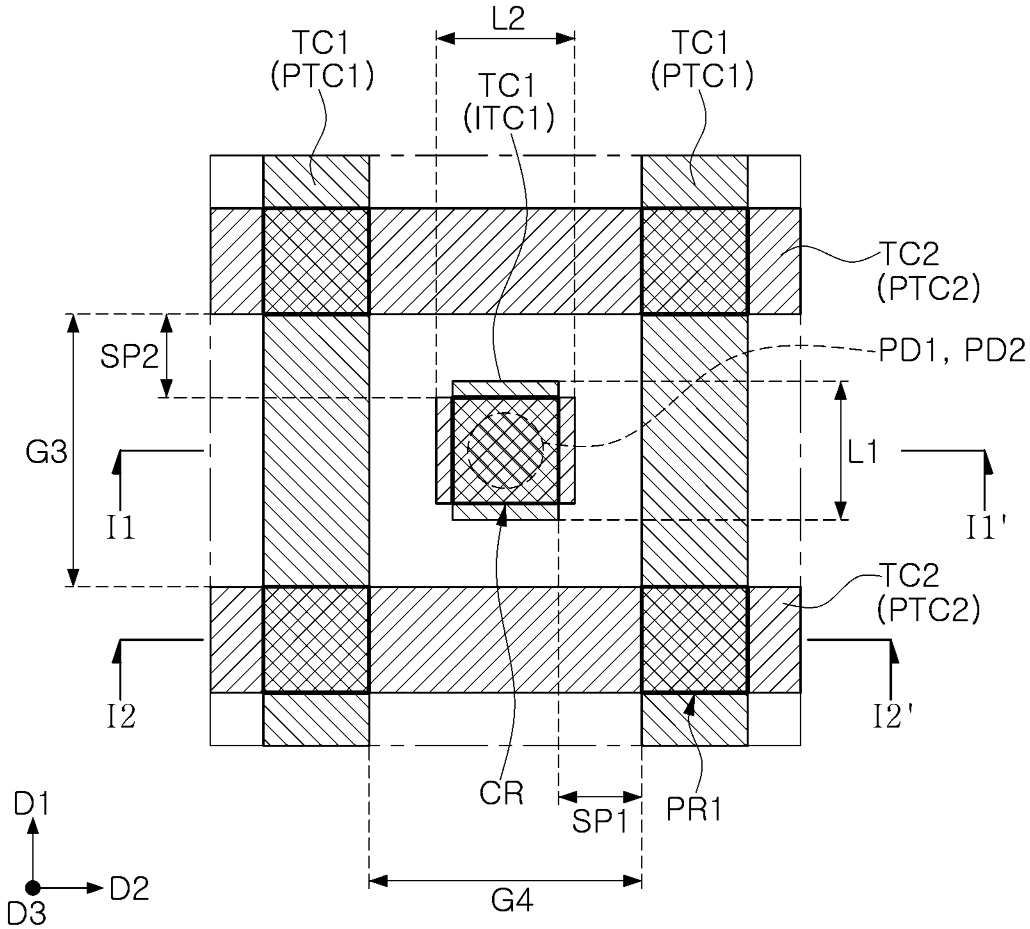
FIG. 6C is a plan view illustrating an arrangement relationship of first and second top conductors of FIGS. 6A and 6B.

FIGS. 6A and 6B are partially enlarged views of a semiconductor package 10*c* according to an example embodiment of the present disclosure, and FIG. 6C is a plan view illustrating an arrangement relationship of first top conductors TC1 and second top conductors TC2 of FIGS. 6A and 6B. FIG. 6A is a cross-sectional view taken along line I1-I1' of FIG. 6C, and FIG. 6B is a cross-sectional view taken along line 12-12 of FIG. 6C.

Referring to FIGS. 6A, 6B, and 6C, the semiconductor package 10*c* according to an example embodiment may have features the same as or similar to those described with reference to FIGS. 1A to 5B, except that the first interconnecting conductors ICT1 and the second interconnector conductors ICT2 do not overlap the first peripheral conductors PTC1 and the second peripheral conductors PTC2. The first interconnecting conductors ICT1 and the second interconnecting conductors ICT2 may be provided for signal transmission, but embodiments of the present disclosure are not limited thereto.

A length L1 of the first interconnecting conductor ICT1 may be less than a gap G3 between adjacent second peripheral conductors PTC2. A length L2 of the second interconnecting conductor ICT2 may be less than a gap G4 between adjacent first peripheral conductors PTC1.

In a plan view, first overlapping regions PRI between the first peripheral conductors PTC1 and the second peripheral conductors PTC2 may be spaced apart from each other in the first horizontal direction D1 and the second horizontal direction D2. The gap G3 between the first overlapping regions PRI in the first horizontal direction D1 may be greater than a distance SP2 between a second interconnecting conductor ITC2 and the second peripheral conductors PTC2, and a gap G4 between the first overlapping regions PR1 in the second horizontal direction D2 may be greater than a distance SP1 between a first interconnecting conductor ITC1 and the first peripheral conductors PTC1. The distance SP1 and the distance SP2 may be about 50 μm or less, for example, may range from about 1 μm to about 50 μm, from about 1 μm to about 40 μm, from about 1 μm to about 30 μm, from about 1 μm to about 20 μm, or from about 5 μm to about 10 μm, but embodiments of the present disclosure are not limited thereto.

Figure 7A:
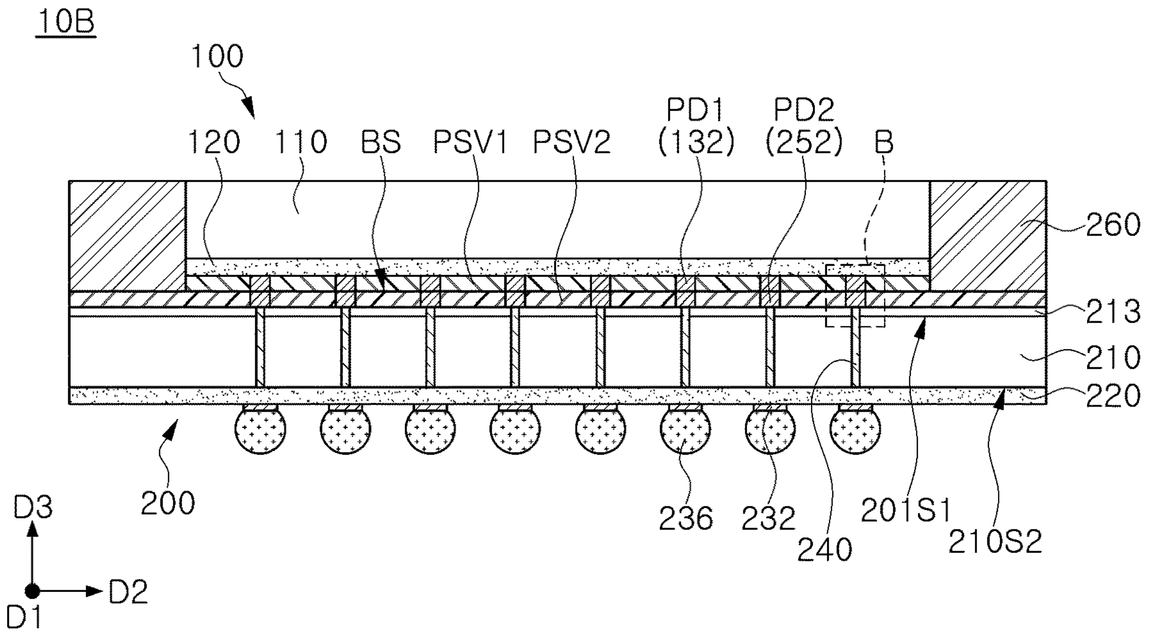
FIG. 7A is a cross-sectional view of a semiconductor package according to an example embodiment of the present disclosure.
Figure 7B:
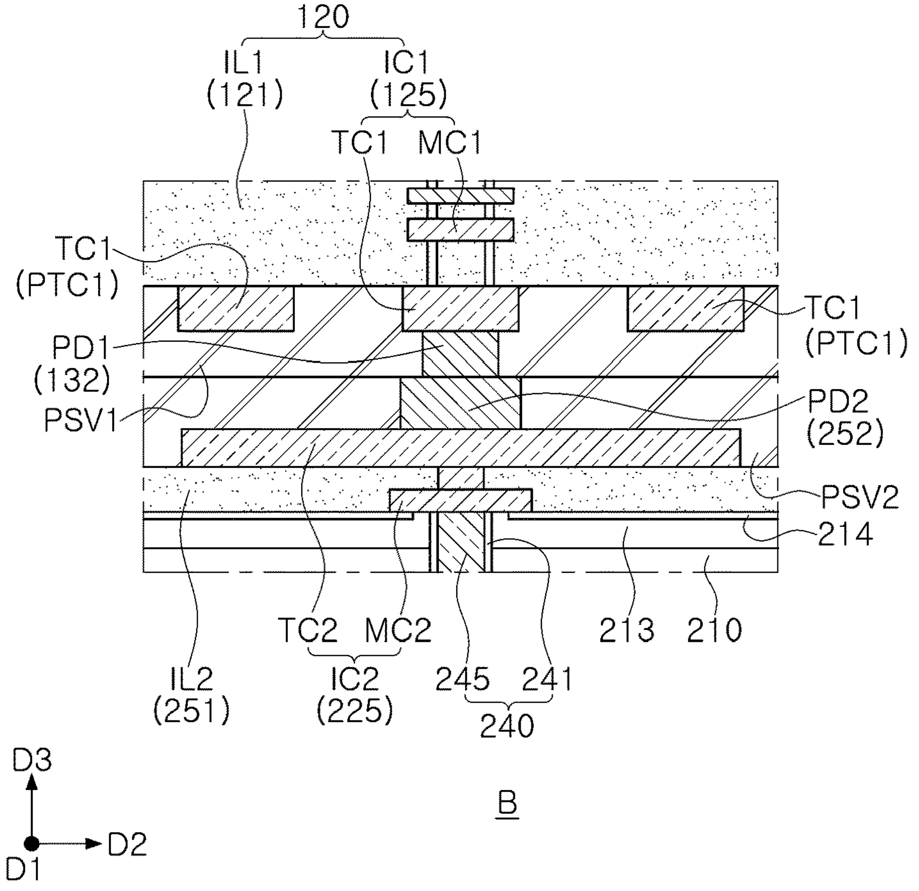
FIG. 7B is a partially enlarged view of a region "B" of FIG. 7A.

FIG. 7A is a cross-sectional view of a semiconductor package 10B according to an example embodiment of the present disclosure, and FIG. 7B is a partially enlarged view of a region B of FIG. 7A.

Referring to FIGS. 7A and 7B, the semiconductor package 10B according to an example embodiment may have features the same as or similar to those described with reference to FIGS. 1A to 6C, except that a second circuit layer 220 is disposed on the other surface 210S2 of the second substrate 210.

The other surface 210S2 of the second substrate 210 may be referred to as a "front surface." The second circuit layer 220 may include the individual devices, the front interconnection, and the interlayer insulating layer described with reference to FIGS. 1A and 1B.

A second interconnection IC2, a second insulating layer IL2, a second pad PD2, and a second passivation layer PSV2 may be disposed on one surface 210S1 of the second substrate 210. Here, the one surface 210S1 of the second substrate 210 may be referred to as a "rear surface." The second interconnection IC2, the second insulating layer IL2, and the second pad PD2 may be referred to as a rear interconnection 225, a rear insulating layer 251, and a protruding electrode 252 (e.g., a rear pad), respectively. The rear interconnection 255, the rear insulating layer 251, and the protruding electrode 252 have features similar to those of the front interconnection, the front insulating layer, and the front pad described above, and thus repeated descriptions will be omitted. A buffer film 214 may be disposed between an insulating protective layer 213 and the second insulating layer IL2. The buffer film 214 may include silicon nitride, silicon carbide, silicon oxynitride, or silicon carbonitride.

Figure 8:
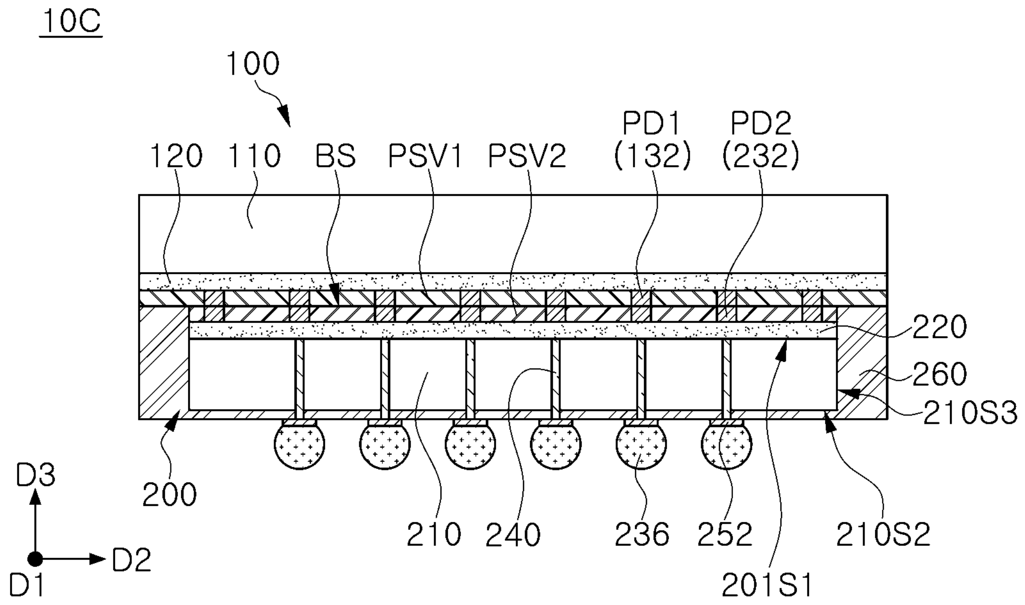
FIG. 8 is a cross-sectional view of a semiconductor package according to an example embodiment of the present disclosure.

FIG. 8 is a cross-sectional view of a semiconductor package 10C according to an example embodiment of the present disclosure.

Referring to FIG. 8, the semiconductor package 10C according to an example embodiment may have features the same as or similar to those described with reference to FIGS. 1A to 7B, except that the first semiconductor chip 100 is larger than the second semiconductor chip 200.

A size (e.g., planar area, width, or the like) of the first semiconductor chip 100 may be larger than a size of the second semiconductor chip 200. The second semiconductor chip 200 may be disposed in a direction in which a second circuit layer 220 opposes a first circuit layer 120. Through-electrodes 240 may protrude from the other surface 210S2 of a second substrate 210 to be electrically connected to protruding electrodes 252. A mold layer 260 may cover a side surface 210S3 of the second semiconductor chip 200 and the other surface 210S2, and may be formed to surround ends of the through-electrodes 240. In some example embodiments, a lower passivation layer, covering the protruding electrodes 252 and connection bumps 236, may be further formed below the mold layer 260.

Figure 9:
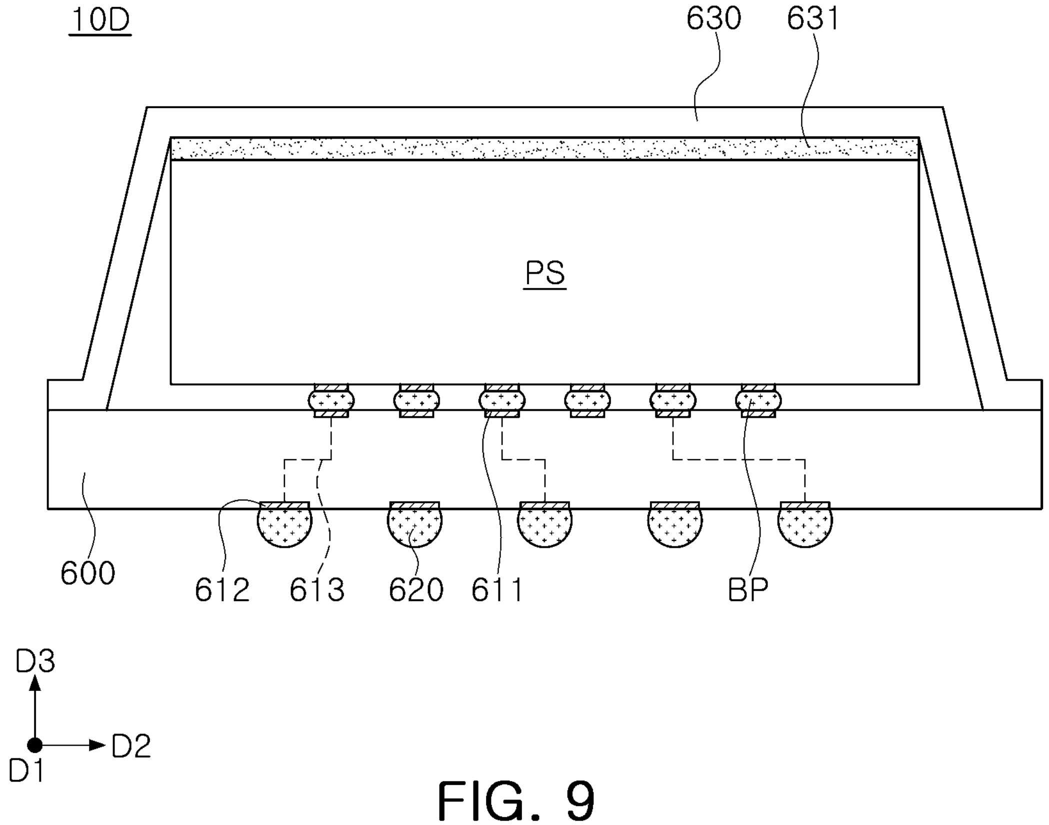
FIG. 9 is a cross-sectional view of a semiconductor package according to an example embodiment of the present disclosure.

FIG. 9 is a cross-sectional view of a semiconductor package 10D according to an example embodiment of the present disclosure.

Referring to FIG. 9, the semiconductor package 10D according to an example embodiment may include a package structure PS, an interconnection substrate 600, and a heat dissipation structure 630. The package structure PS may include a first semiconductor chip, a second semiconductor chip, and a mold layer, and may be understood as a stack chip structure having features the same as or similar to those described with reference to FIGS. 1A to 8. For example, the package structure may be or include the semiconductor package 10A, the semiconductor package 10*a*, the semiconductor package 10*b*, the semiconductor package 10*c*, the semiconductor package 10B, or the semiconductor package 10C.

The interconnection substrate 600 may be a support substrate on which the package structure PS is mounted, and may be a substrate for a semiconductor package, such as a printed circuit board (PCB), a ceramic substrate, or a tape interconnection substrate. The package structure PS may be electrically connected to the interconnection substrate 600 through a metal bump BP. The interconnection substrate 600 may include a lower pad 612, an upper pad 611, and an interconnection circuit 613 electrically connecting the lower pad 612 and the upper pad 611 to each other. A body of the interconnection substrate 600 may include different materials depending on a type of substrate. For example, when the interconnection substrate 600 is a printed circuit board, the interconnection substrate 600 may be in the form of a body copper clad laminate or an interconnection layer additionally stacked on one surface or both surfaces of the copper clad laminate. An external connection bump 620 may be disposed on a lower portion of the interconnection substrate 600. The external connection bump 620 may include tin (Sn), indium (In), bismuth (Bi), antimony (Sb), copper (Cu), silver (Ag), zinc (Zn), lead (Pb), and/or alloys thereof.

The heat dissipation structure 630 may be disposed to cover an upper portion of the package structure PS. The heat dissipation structure 630 may be attached to the interconnection substrate 600 using an adhesive. The adhesive may be a thermally conductive adhesive tape, thermally conductive grease, or thermally conductive adhesive.

The heat dissipation structure 630 may be attached to the upper portion of the package structure PS through a heat transfer material layer 631. The heat transfer material layer 631 may include, for example, a thermally conductive adhesive tape, thermally conductive grease, or thermally conductive adhesive.

The heat dissipation structure 630 may include a conductive material having excellent thermal conductivity. For example, the heat dissipation structure 630 may include a metal or a metal alloy including gold (Au), silver (Ag), copper (Cu), or iron (Fe), or a conductive material such as graphite or graphene. The heat dissipation structure 630 may have a shape different from the shape illustrated in FIG. 9. For example, the heat dissipation structure 630 may be formed to cover only an upper surface of the package structure PS.

Figure 10:
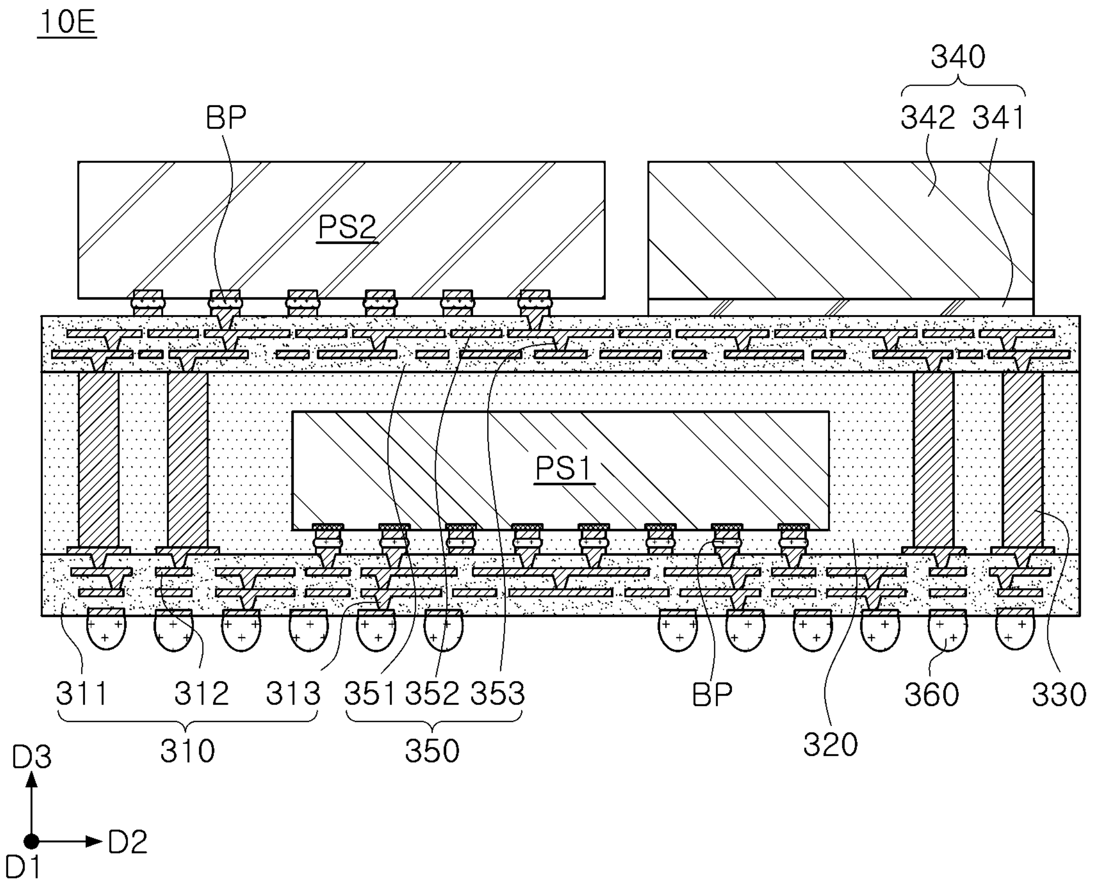
FIG. 10 is a cross-sectional view of a semiconductor package according to an example embodiment of the present disclosure.

FIG. 10 is a cross-sectional view of a semiconductor package 10E according to an example embodiment of the present disclosure.

Referring to FIG. 10, the semiconductor package 10E according to an example embodiment may include a first package structure PS1, a second package structure PS2, a lower redistribution structure 310, an encapsulant 320, posts 330, and an upper redistribution structure 350.

The first package structure PS1 may be understood as a stack chip structure having features the same as or similar to those (e.g., semiconductor packages) described with reference to FIGS. 1A to 8. The first package structure PS1 may be connected to a lower redistribution layer 312 through metal bumps BP.

The second package structure PS2 may be disposed on the upper redistribution structure 350. The second package structure PS2 may be connected to an upper redistribution layer 352 through the metal bumps BP. The second package structure PS2 may be electrically connected to the lower redistribution layer 312 through a plurality of posts 330.

The second package structure PS2 may be a bare chip or a packaged chip on which a logic circuit or a memory circuit is formed. In some example embodiments, the second package structure PS2 may include a plurality of semiconductor chips. The second package structure PS2 may include a type of semiconductor chip different from a type of semiconductor chip of the first package structure PS1. For example, the first package structure PS1 may include a logic chip, and the second package structure PS2 may include a memory chip.

A heat dissipation member 340 may be disposed on at least one side of the second package structure PS2. In some example embodiments, the heat dissipation member 340 may have a shape surrounding four surfaces of an upper chip structure (e.g., the second semiconductor chip 200). The heat dissipation member 340 may control warpage of the semiconductor package 10E, and may externally radiate heat generated from the first package structure PS1.

The heat dissipation member 340 may include a heat transfer material layer 341 and a heat slug 342. The heat transfer material layer 341 may include, for example, a thermally conductive adhesive tape, thermally conductive grease, or thermally conductive adhesive. The heat slug 342 may be disposed on the heat transfer material layer 341. The heat slug 342 may include a material having excellent thermal conductivity, such as aluminum (Al), gold (Au), silver (Ag), copper (Cu), iron (Fe), graphite, or graphene.

The lower redistribution structure 310 may include a support substrate on which a lower chip structure (e.g., the first semiconductor chip 100) is mounted, and may include a lower insulating layer 311, lower redistribution layers 312, and a lower redistribution via 313. The lower insulating layer 311 may include a photosensitive resin, for example, a prepreg, an Ajinomoto build-up film (ABF), FR-4, bismaleimide-triazine (BT), or a photoimageable dielectric (PID). The lower redistribution layer 312 may redistribute the first package structure PS1. The lower redistribution layer 312 may include, for example, a metal including copper (Cu), aluminum (Al), silver (Ag), tin (Sn), gold (Au), nickel (Ni), lead (Pb), and titanium (Ti), or alloys thereof. The lower redistribution via 313 may be a filled via in which the a via hole is filled with a metal material, or a conformal via in which the metal material extends along an inner wall of the via hole.

The encapsulant 320 may cover the first package structure PS1 and the posts 330. The encapsulant 320 may include, for example, a prepreg, an ABF, FR-4, BT, an EMC.

The posts 330 may pass through the encapsulant 320 to electrically connect the lower redistribution layer 312 and upper redistribution layer 352 to each other. The posts 330 may include copper (Cu), nickel (Ni), titanium (Ti), lead (Pb), aluminum (Al), silver (Ag), gold (Au), platinum (Pt), or alloys thereof.

The upper redistribution structure 350 may be disposed on the encapsulant 320, and may include an upper insulating layer 351, upper redistribution layers 352, and an upper redistribution via 353. The upper insulating layer 351, the upper redistribution layers 352, and the upper redistribution via 353 may have features the same as or similar to those of the lower insulating layer 311, the lower redistribution layer 312, and the lower redistribution via 313 described above, and thus repeated descriptions will be omitted.

External connection bumps 360 may connect the semiconductor package 10E to an external device such as a module substrate or system board. The external connection bumps 360 may include, for example, tin (Sn) or an alloy (e.g., Sn—Ag—Cu) including tin (Sn).

Figure 11A:
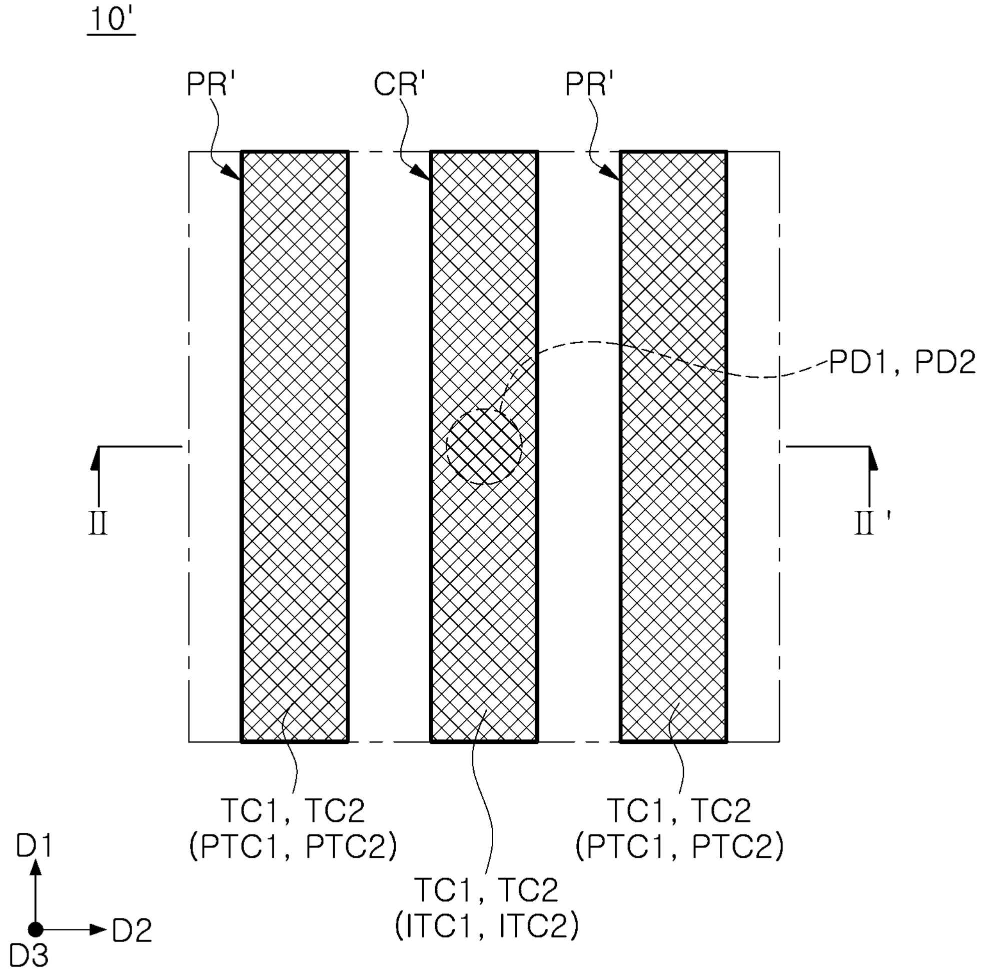
FIG. 11A is a plan view illustrating an arrangement relationship of top conductors in a semiconductor package according to a comparative example.
Figure 11B:
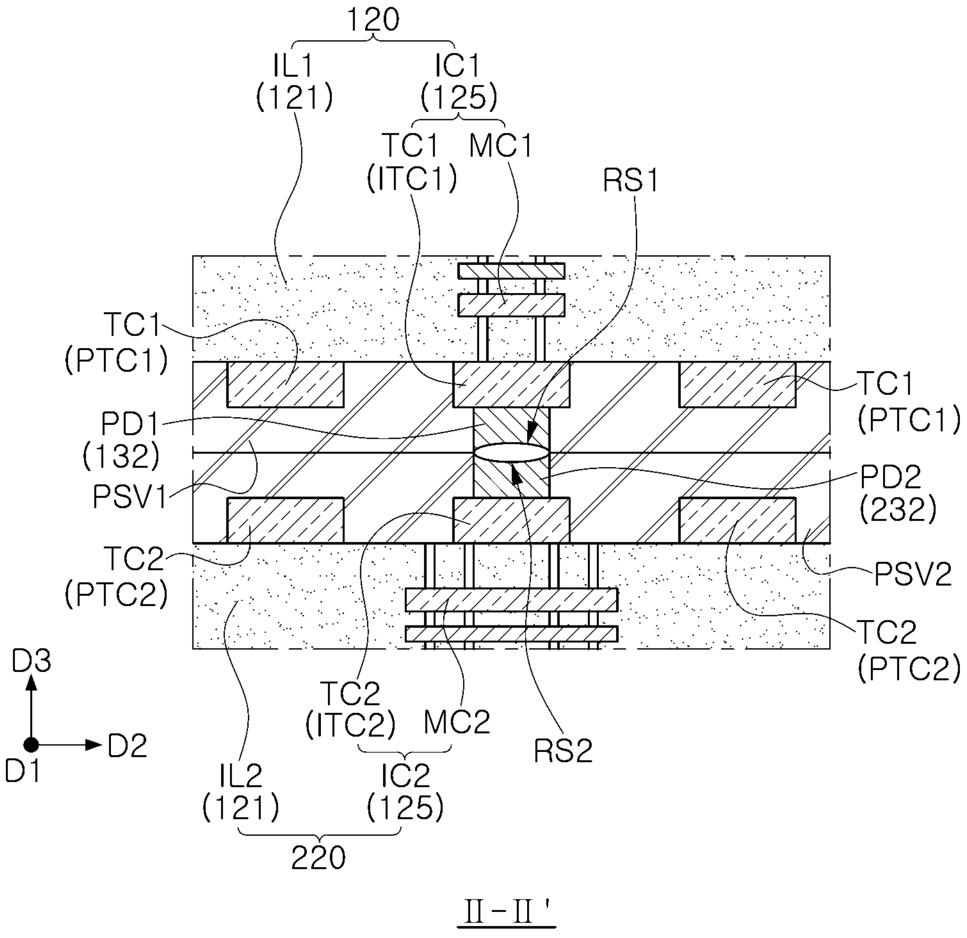
FIG. 11B is a diagram illustrating a bonding surface according to the comparative example, formed using thermocompression bonding.
Figure 11C:
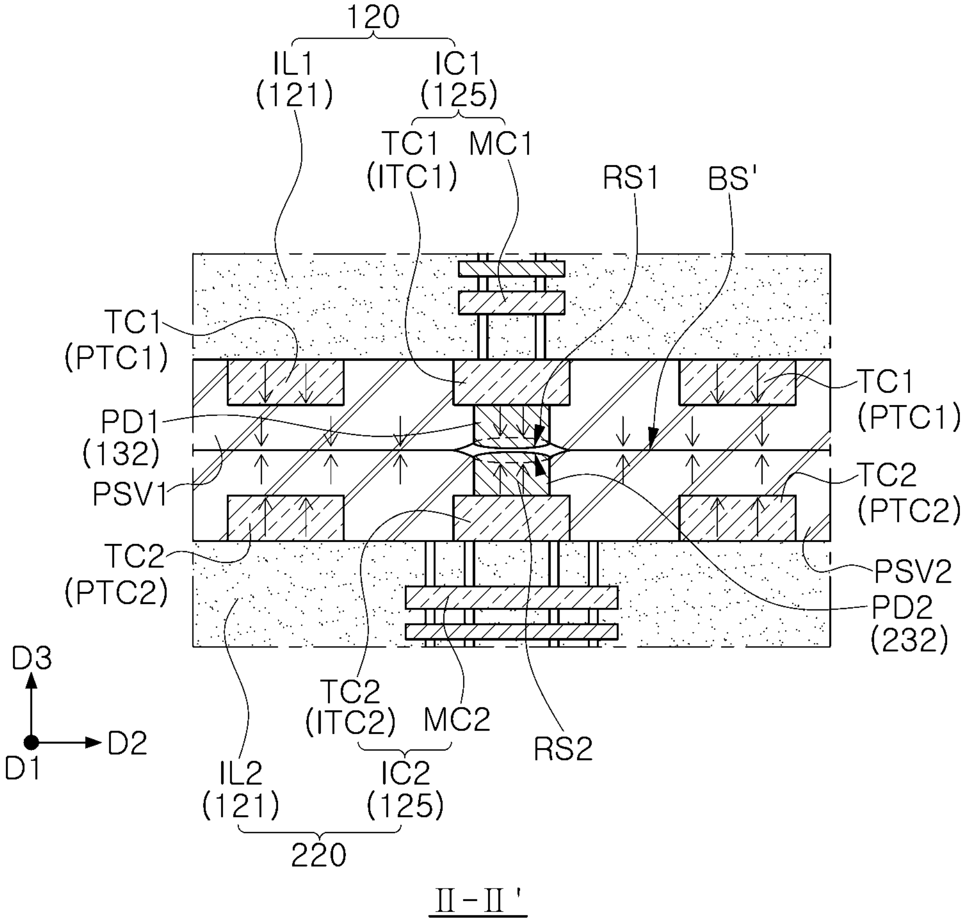
FIG. 11C is a diagram illustrating a bonding surface according to the comparative example, formed using thermocompression bonding.

FIG. 11A is a plan view illustrating an arrangement relationship of first top conductors TC1 and second top conductors TC2 in a semiconductor package 10' according to a comparative example, and FIGS. 11B and 11C are diagrams illustrating a bonding surface BS' according to the comparative example, formed using thermocompression bonding. FIGS. 11B and 11C illustrate cross-sections taken along line II-II' of FIG. 11A.

Referring to FIG. 11A, the semiconductor package 10' according to the comparative example may include first top conductors TC1 and second top conductors TC2 extending in the same direction. For example, a first top conductor TC1 and a second top conductor TC2 may extend in a first horizontal direction D1. The first top conductor TC1 may include a first interconnecting conductor ITC1 and first peripheral conductors PTC1. The second top conductor TC2 may include a second interconnecting conductor ITC2 and second peripheral conductors PTC2.

The first interconnecting conductor ITC1 and the second interconnecting conductor ITC2, corresponding to each other, may form a first overlapping region CR'. The first peripheral conductors PTC1 and the second peripheral conductors PTC2, corresponding to each other, may form a second overlapping region PR'. The first overlapping region CR' and the second overlapping region PR' according to the comparative example may continuously extend around a first pad PD1 and a second pad PD2.

Referring to FIG. 11B, in order to perform a thermocompression process, the first pad PD1, the second pad, PD2, a first passivation layer PSV1, and a second passivation layer PSV2 may be planarized. A first dishing surface RS1 and a second dishing surface RS2 may be formed on the surfaces of the first pad PD1 and the second pad PD2, respectively. the first dishing surface RS1 on the first pad PD1 may be disposed to oppose the second dishing surface RS2 on the second pad PD2.

Referring to FIG. 11C, the thermal compression process may be performed to bond and couple the first pad PD1 and the second pad PD2 to each other. The first pad PD1 and the second pad PD2 may expand in directions, opposing each other. However, in the first overlapping region CR' and the second overlapping region PR' according to the comparative example, the first passivation layer PSV1 and the second passivation layer PSV2 may expand together with the first top conductor TC1 and the second top conductor TC2, resulting in non-bonding between the first pad PD1 and the second pad PD2 and non-bonding between the first passivation layer PSV1 and the second passivation layer PSV2, and a degradation in quality of the bonding surface BS'.

For example, the first passivation layer PSV1, adjacent to the first pad PD1 in the first horizontal direction D1, may downwardly expand due to the first interconnecting conductors ITC1, and the second passivation layer PSV2, adjacent to the first pad PD1 in the first horizontal direction D1, may upwardly expand due to the second peripheral conductors PTC2. The first passivation layer PSV1, adjacent to the first pad PD1 in a second horizontal direction D2, may downwardly expand due to the first peripheral conductors PTC1, and the second passivation layer PSV2, adjacent to the first pad PD1 in the second horizontal direction D2, may upwardly expand due to the second peripheral conductors PTC2 (see FIG. 11C), resulting in a reduction in bonding reliability between the first dishing surface RS1 and the second dishing surface RS2.

Figure 12A:
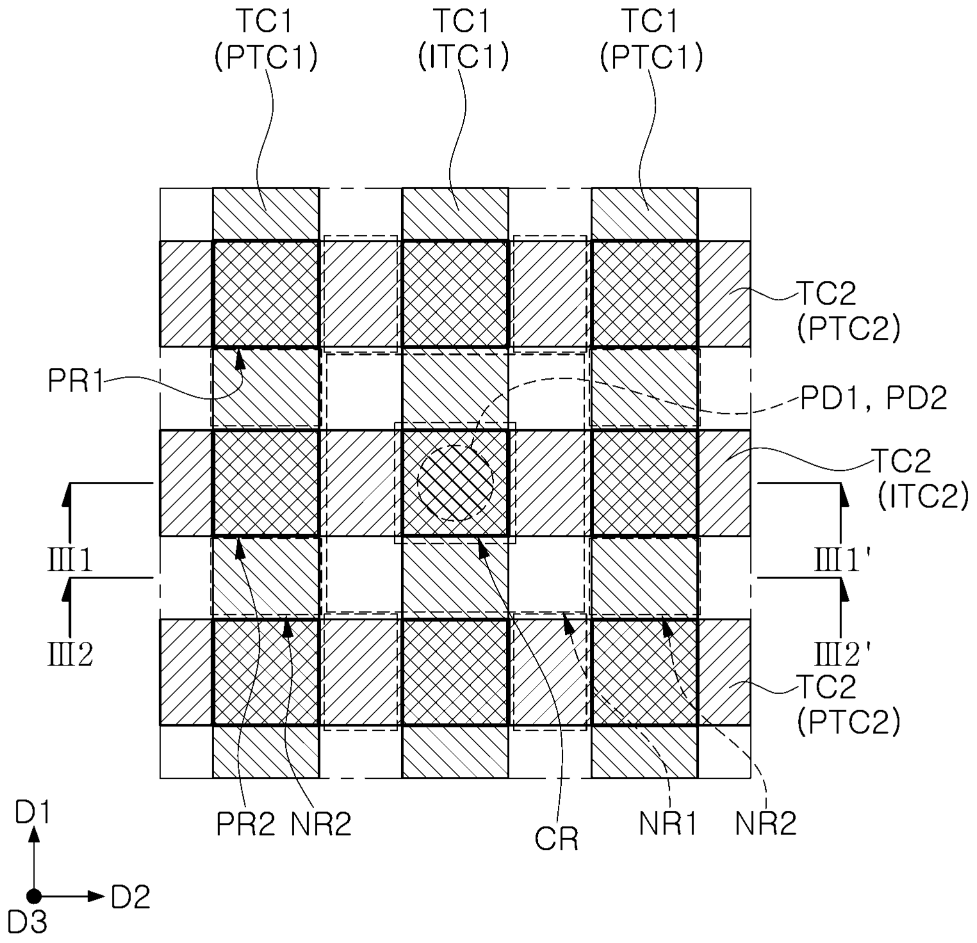
FIG. 12A is a plan view illustrating an arrangement relationship of top conductors according to an example embodiment.
Figure 12B:
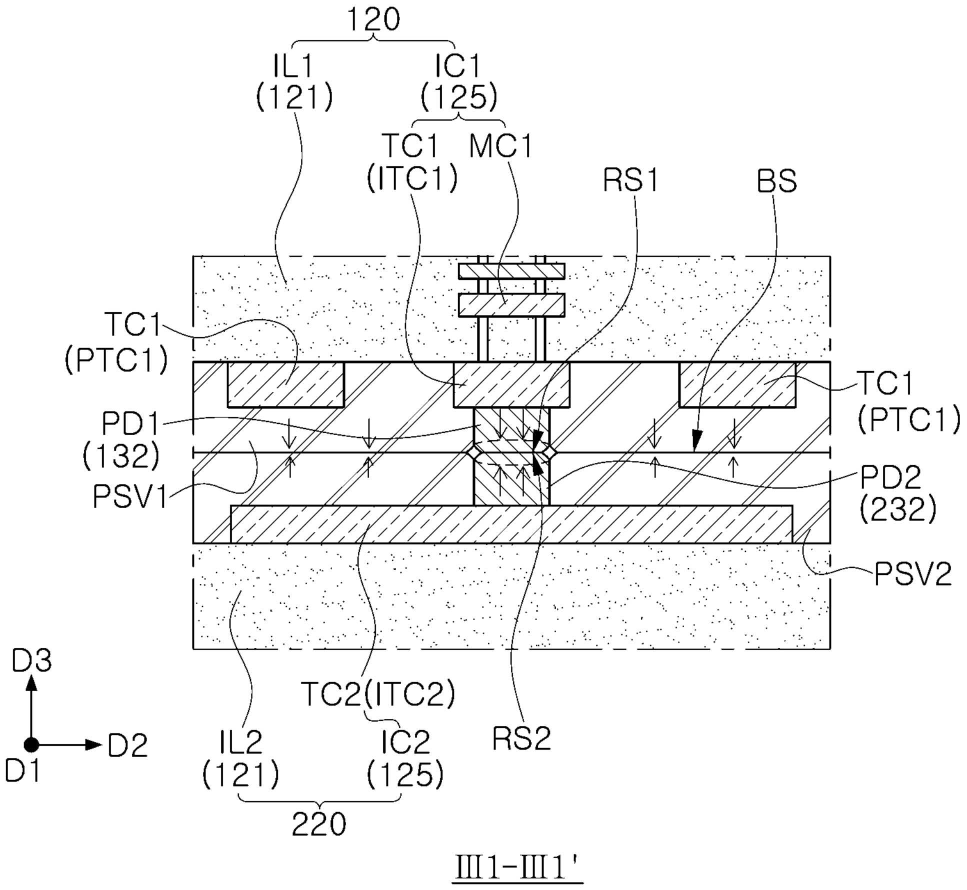
FIG. 12B is a diagram illustrating a bonding surface according to the example embodiment of FIG. 12A, formed using thermocompression bonding.
Figure 12C:
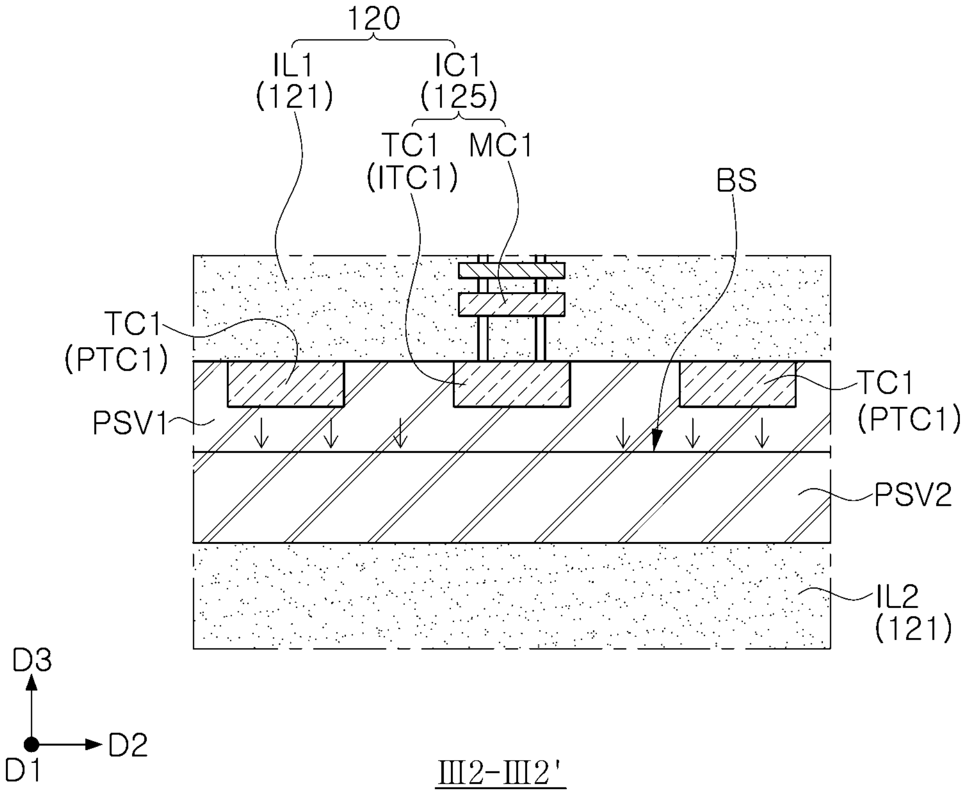
FIG. 12C is a diagram illustrating a bonding surface according to the example embodiment of FIG. 12A, formed using thermocompression bonding.

FIG. 12A is a plan view illustrating an arrangement relationship of top conductors according to an example embodiment, and FIGS. 12B and 12C are diagrams illustrating a bonding surface according to the example, formed using thermocompression bonding. FIG. 12B illustrates a cross-section taken along line III1-III1' of FIG. 12A, and FIG. 12C illustrates a cross-section taken along line III2-III2' of FIG. 12A.

Referring to FIGS. 12A, 12B, and 12C, a semiconductor package according to an example embodiment may include top conductors extending in different directions. For example, a first top conductor TC1 may extend in a first horizontal direction D1, and a second top conductor TC2 may extend in a second horizontal direction D2.

In a plan view, an overlapping region CR between a first interconnecting conductor ITC1, a first pad PD1, a second interconnecting conductor ITC2, and a second pad PD2 may be spaced apart from first overlapping regions PR1. The overlapping region CR may be surrounded by a first non-overlapping region NR1 in which the first interconnecting conductor ITC1, first peripheral conductors PTC1, the second interconnecting conductor ITC2, and second peripheral conductors PTC2 do not overlap each other.

In the plan view, third overlapping regions PR2, in which the first interconnecting conductor ITC1 and the second interconnecting conductor ITC2 respectively overlap the second peripheral conductors PTC2 and the first peripheral conductors PTC1, may be disposed alternately with the first overlapping regions PR1 in the first horizontal direction D1 and the second horizontal direction D2. The overlapping region CR may be surrounded by second non-overlapping regions NR2 between the first overlapping regions PR1 and the third overlapping regions PR2.

As illustrated in FIGS. 12B and 12C, in the first non-overlapping region NR1 and the second non-overlapping region NR2, expansion of the first passivation layer PSV1 and the second passivation layer PSV2 may be reduced, thereby suppressing non-bonding between the first pad PD1 and the second pad PD2 and non-bonding between the first passivation layer PSV1 and the second passivation layer PSV2, and securing bonding reliability between a first dishing surface RS1 and a second dishing surface RS2.

FIGS. 13A to 13E are diagrams illustrating a method of manufacturing a semiconductor package according to an example embodiment.

Figure 13A:
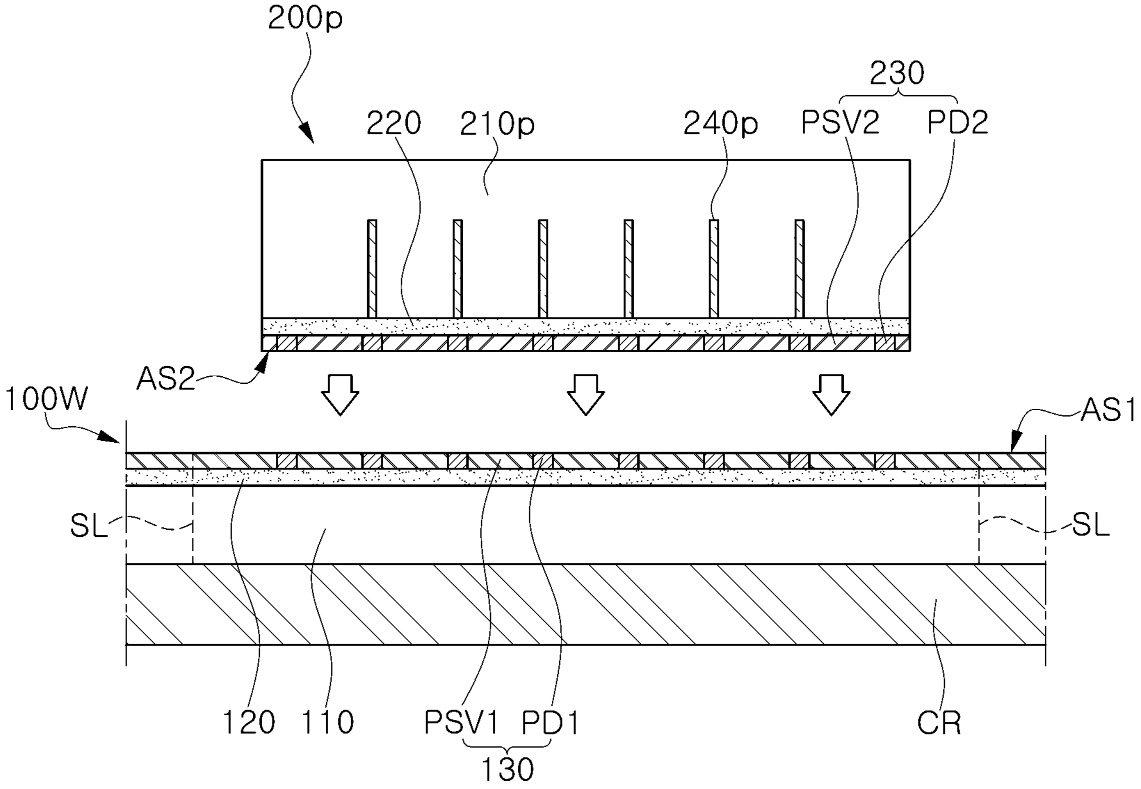
FIGS. 13A to 13E are diagrams illustrating a method of manufacturing a semiconductor package according to an example embodiment.

Referring to FIG. 13A, a semiconductor wafer 100W for a first semiconductor chip 100 may be prepared. The semiconductor wafer 100W may include a plurality of first semiconductor chips 100 divided by a scribe line SL. The semiconductor wafer 100W may include a first substrate 110, a first circuit layer 120, and a first bonding layer 130 formed thereon. The first bonding layer 130 may include a first passivation layer PSV1 and a first pad PD1. The semiconductor wafer 100W may be disposed on a carrier CR such that a first active surface AS1 of the semiconductor wafer 100W faces upwards.

Subsequently, a preliminary semiconductor chip 200*p* may be attached to the semiconductor wafer 100W. The preliminary semiconductor chip 200*p* may include a preliminary substrate 210*p* before having an adjusted thickness using a back-grinding process, a second circuit layer 220 and a second bonding layer 230 disposed on an active surface AS2 of the preliminary substrate 210*p*, and a plurality of preliminary through-electrodes 240*p* embedded in the preliminary substrate 210*p*. The second bonding layer 230 may include a second passivation layer PSV2 and a second pad PD2. The preliminary semiconductor chip 200*p* may be disposed on the semiconductor wafer 100W such that the second active surface AS2 is in contact with the first active surface AS1.

Thereafter, a thermal compression process may be performed to couple the first semiconductor chip 100 and the preliminary semiconductor chip 200*p* to each other. The thermal compression process may be performed in a thermal atmosphere ranging from about 100° C. to about 300° C. However, the temperature of the thermal atmosphere is not limited to the above-described range, and may vary.

Figure 13B:
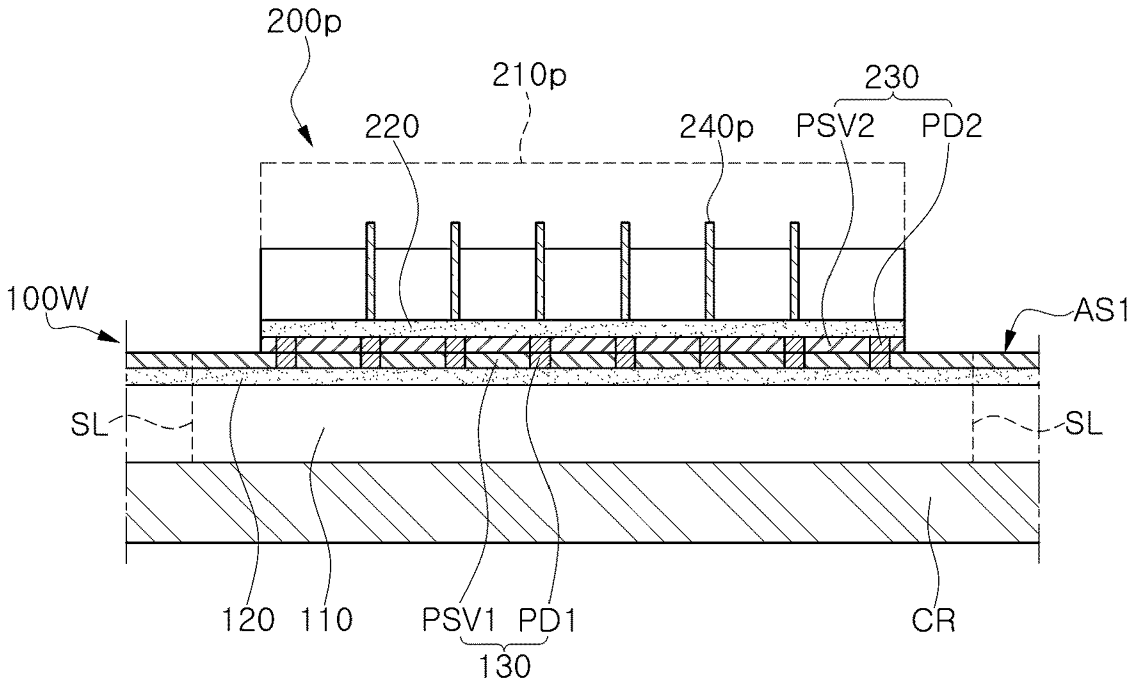

Referring to FIG. 13B, the preliminary substrate 210*p* may be etched such that at least a portion of each of the plurality of preliminary through-electrodes 240*p* is exposed to an inactive surface of the preliminary semiconductor chip 200*p*. A back-grinding process and an etch-back process may be applied to the preliminary substrate 210*p* to form a second substrate 210 (see FIG. 13C) having a desired thickness. For example, the back-grinding process may be performed to reduce the thickness of the preliminary substrate 210*p* to a predetermined thickness, and the etch-back process may be applied under appropriate conditions to sufficiently expose the plurality of preliminary through-electrodes 240*p*.

Figure 13C:
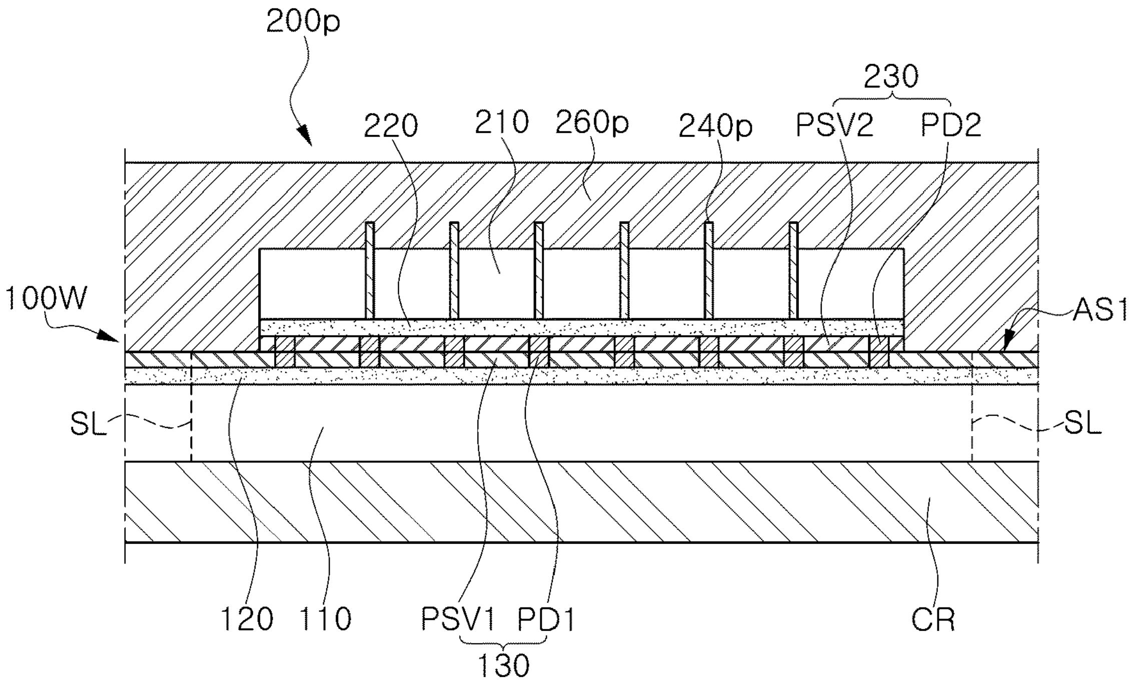

Referring to FIG. 13C, a preliminary mold layer 260*p*, covering the preliminary semiconductor chip 200*p*, may be formed. The preliminary mold layer 260*p* may cover the inactive surface of the preliminary semiconductor chip 200*p* and each of the plurality of preliminary through-electrodes 240*p* exposed from the preliminary substrate 210*p*.

Figure 13D:
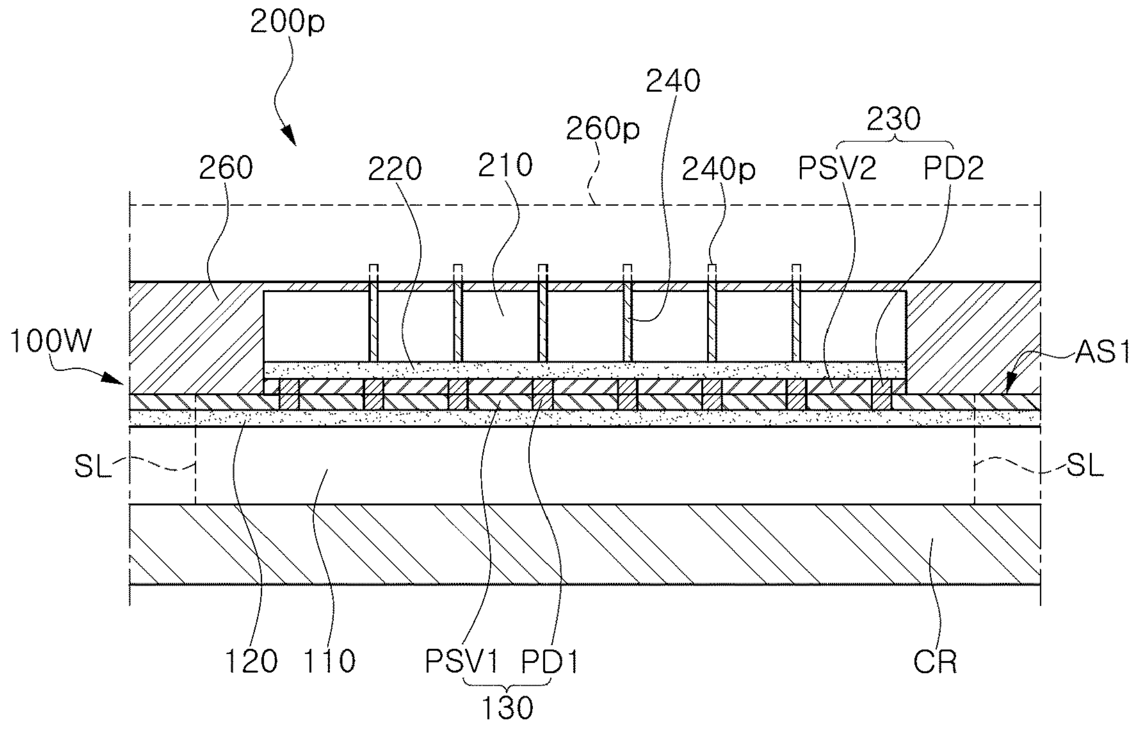

Referring to FIG. 13D, a polishing process may be applied to the preliminary mold layer 260*p* and the plurality of preliminary through-electrodes 240*p* to form a plane including a mold layer 260 and a plurality of through-electrodes 240. The polishing process may include a chemical mechanical polishing (CMP) process.

Figure 13E:
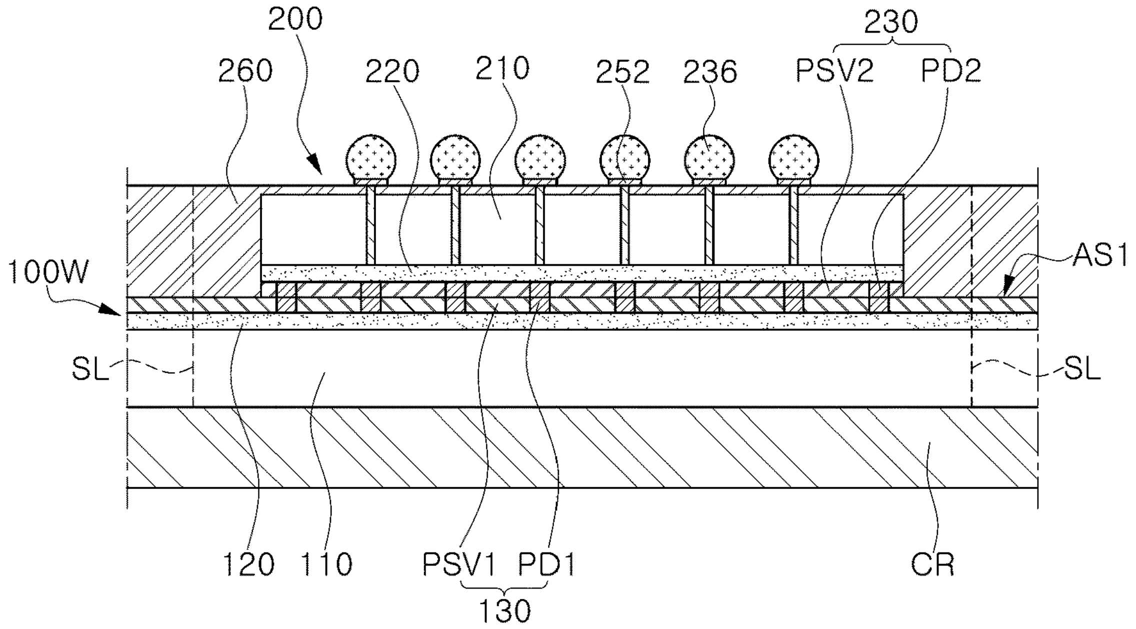

Referring to FIG. 13E, protruding electrodes 252 and connection bumps 236 may be sequentially formed on the plane, formed using the polishing process. Thereafter, the semiconductor packages may be separated from each other by performing a cutting process along the scribe line SL.

According to example embodiments of the present disclosure, a semiconductor package may have improved reliability by minimizing an overlapping region between top conductors respectively adjacent to bonded pads.

While non-limiting example embodiments have been illustrated and described above, it will be apparent to those skilled in the art that modifications and variations could be made without departing from the scope of the present disclosure.

What is claimed is:

1. A semiconductor package comprising:

a first semiconductor chip; and a second semiconductor chip, wherein the first semiconductor chip opposes the second semiconductor chip in a vertical direction, wherein the first semiconductor chip comprises:

a first substrate;

a first interconnection on a first surface of the first substrate;

a first insulating layer covering at least a portion of the first interconnection;

at least one first pad on the first interconnection; and a first passivation layer surrounding at least a portion of the at least one first pad, wherein the second semiconductor chip comprises:

a second substrate;

a second interconnection on a first surface of the second substrate;

a second insulating layer covering at least a portion of the second interconnection;

at least one second pad on the second interconnection, the at least one second pad in contact with the at least one first pad; and a second passivation layer covering at least a portion of the at least one second pad, the second passivation layer in contact with the first passivation layer, wherein the first interconnection comprises at least one first interconnecting conductor in contact with the at least one first pad, and first peripheral conductors on opposite sides of the at least one first interconnecting conductor, the first peripheral conductors extending in a first horizontal direction, wherein the second interconnection comprises at least one second interconnecting conductor in contact with the at least one second pad, and second peripheral conductors on opposite sides of the at least one second interconnecting conductor, the second peripheral conductors extending in a second horizontal direction, intersecting the first horizontal direction, and wherein first overlapping regions, in which the first peripheral conductors overlap with the second peripheral conductors, are spaced apart from each other in the first horizontal direction and the second horizontal direction in a plan view.

2. The semiconductor package of claim 1, wherein, in the plan view, each of the first overlapping regions has a first width in the first horizontal direction and a second width in the second horizontal direction.

3. The semiconductor package of claim 2, wherein the first width is equal to or greater than line widths of the second peripheral conductors, and the second width is equal to or greater than line widths of the first peripheral conductors.

4. The semiconductor package of claim 3, wherein each of the line widths of the first peripheral conductors and the line widths of the second peripheral conductors are in a range from 1 μm to 50 μm.

5. The semiconductor package of claim 1, wherein, in the plan view, a second overlapping region, in which the at least one first interconnecting conductor, the at least one first pad, the at least one second interconnecting conductor, and the at least one second pad are overlapping, is spaced apart from the first overlapping regions.

6. The semiconductor package of claim 5, wherein the second overlapping region is surrounded by a non-overlapping region in which the at least one first interconnecting conductor, the first peripheral conductors, the at least one second interconnecting conductor, and the second peripheral conductors do not overlap each other.

7. The semiconductor package of claim 1, wherein the at least one first interconnecting conductor extends in the first horizontal direction, wherein the at least one second interconnecting conductor extends in the second horizontal direction, and wherein, in the plan view, second overlapping regions, in which the at least one first interconnecting conductor and the at least one second interconnecting conductor respectively overlap the second peripheral conductors and the first peripheral conductors, are spaced apart from ones of the first overlapping regions, adjacent to the second overlapping regions, in the first horizontal direction and the second horizontal direction.

8. The semiconductor package of claim 7, wherein a first gap between the first overlapping regions and the second overlapping regions in the first horizontal direction is equal to a first distance between the at least one second interconnecting conductor and the second peripheral conductors, and a second gap between the first overlapping regions and the second overlapping regions in the second horizontal direction is equal to a second distance between the at least one first interconnecting conductor and the first peripheral conductors.

9. The semiconductor package of claim 7, wherein the at least one first interconnecting conductor comprises a plurality of first interconnecting conductors spaced apart from each other in the second horizontal direction, wherein the at least one second interconnecting conductor comprises a plurality of second interconnecting conductors spaced apart from each other in the first horizontal direction, wherein the at least one first pad comprises a plurality of first pads respectively on each of the plurality of first interconnecting conductors in the first horizontal direction, and wherein the at least one second pad comprises a plurality of second pads respectively on each of the plurality of second interconnecting conductors in the second horizontal direction, the plurality of second pads respectively in contact with the plurality of first pads.

10. The semiconductor package of claim 9, wherein, in the plan view, the second overlapping regions, in which the plurality of first interconnecting conductors and the plurality of second interconnecting conductors respectively overlap the second peripheral conductors and the first peripheral conductors, are disposed alternately with the first overlapping regions in the first horizontal direction and the second horizontal direction.

11. The semiconductor package of claim 1, wherein the first interconnection further comprises first intermediate conductors between the at least one first interconnecting conductor and the first surface of the first substrate, wherein a thickness of the at least one first interconnecting conductor is greater than thicknesses of the first intermediate conductors, wherein the second interconnection further comprises second intermediate conductors between the at least one second interconnecting conductor and the first surface of the second substrate, and wherein a thickness of the at least one second interconnecting conductor is greater than thicknesses of the second intermediate conductors.

12. The semiconductor package of claim 11, wherein a thickness of the at least one first pad is 0.5 times or more and 2 times or less the thickness of the at least one first interconnecting conductor, and wherein a thickness of the at least one second pad is 0.5 times or more and 2 times or less the thickness of the at least one second interconnecting conductor.

13. The semiconductor package of claim 1, wherein the first semiconductor chip further comprises first individual devices on the first surface of the first substrate, the first individual devices electrically connected to the first interconnection, and wherein the second semiconductor chip further comprises:

second individual devices on the first surface of the second substrate, the second individual devices electrically connected to the second interconnection;

a protruding electrode on a second surface of the second substrate, opposite of the first surface of the second substrate; and a through-electrode passing through the second substrate, the through-electrode electrically connecting the second interconnection to the protruding electrode.

14. The semiconductor package of claim 1, wherein the first semiconductor chip further comprises first individual devices on the first surface of the first substrate, the first individual devices electrically connected to the first interconnection, and wherein the second semiconductor chip further comprises:

second individual devices on a second surface of the second substrate, opposite of the first surface of the second substrate;

a front interconnection electrically connected to the second individual devices;

an interlayer insulating layer covering the front interconnection;

a front pad on the interlayer insulating layer and electrically connected to the front interconnection; and a through-electrode passing through the second substrate, the through-electrode electrically connecting the second interconnection to the front interconnection.

15. A semiconductor package comprising:

a first semiconductor chip; and a second semiconductor chip opposing the first semiconductor chip, wherein the first semiconductor chip comprises:

a first interconnection;

at least one first pad on the first interconnection; and a first passivation layer covering at least a portion of the at least one first pad, wherein the second semiconductor chip comprises:

a second interconnection;

at least one second pad on the second interconnection, the at least one second pad in contact with the at least one first pad; and a second passivation layer covering at least a portion of the at least one second pad, the second passivation layer in contact with the first passivation layer, wherein the first interconnection comprises at least one first interconnecting conductor in contact with the at least one first pad, the at least one first interconnecting conductor elongated in a first horizontal direction, and wherein the second interconnection comprises at least one second interconnecting conductor in contact with the at least one second pad, the at least one second interconnecting conductor elongated in a second horizontal direction, intersecting the first horizontal direction.

16. The semiconductor package of claim 15, wherein, in a plan view, an overlapping region, in which the at least one first interconnecting conductor overlaps with the at least one second interconnecting conductor, has a first width in the first horizontal direction equal to or greater than a line width of the at least one second interconnecting conductor in the first horizontal direction, and a second width in the second horizontal direction equal to or greater than a line width of the at least one first interconnecting conductor in the second horizontal direction.

17. A semiconductor package comprising:

a first semiconductor chip; and a second semiconductor chip, wherein the first semiconductor chip opposes the second semiconductor chip in a vertical direction, wherein the first semiconductor chip comprises:

a first interconnection;

a first insulating layer covering at least a portion of the first interconnection;

a plurality of first pads on the first insulating layer, the plurality of first pads electrically connected to the first interconnection; and a first passivation layer covering at least a portion of the plurality of first pads, wherein the second semiconductor chip comprises:

a second interconnection;

a second insulating layer covering at least a portion of the second interconnection;

a plurality of second pads on the second insulating layer, the plurality of second pads electrically connected to the second interconnection, the plurality of second pads respectively in contact with the plurality of first pads; and a second passivation layer covering at least a portion of the plurality of second pads, the second passivation layer in contact with the first passivation layer, wherein the first interconnection comprises first intermediate conductors, and first top conductors between the first intermediate conductors and the plurality of first pads in the vertical direction, wherein the second interconnection comprises second intermediate conductors, and second top conductors between the second intermediate conductors and the plurality of second pads in the vertical direction, wherein at least some of the first top conductors extend in a first horizontal direction, and wherein at least some of the second top conductors extend in a second horizontal direction, intersecting the first horizontal direction.

18. The semiconductor package of claim 17, wherein thicknesses of the first top conductors are greater than thicknesses of the first intermediate conductors, and wherein thicknesses of the second top conductors are greater than thicknesses of the second intermediate conductors.

19. The semiconductor package of claim 17, wherein the first top conductors and the second top conductors comprise at least one from among aluminum (Al), copper (Cu), and an alloy thereof, and wherein the plurality of first pads and the plurality of second pads comprise at least one from among copper (Cu) and an alloy thereof.

20. The semiconductor package of claim 17, wherein the first passivation layer and the second passivation layer comprise at least one from among silicon oxide (SiO) and silicon carbonitride (SiCN).

* * * * *